United States Patent
Guo et al.

(10) Patent No.: US 8,027,086 B2
(45) Date of Patent: Sep. 27, 2011

(54) ROLL TO ROLL NANOIMPRINT LITHOGRAPHY

(75) Inventors: Lingjie Jay Guo, Ann Arbor, MI (US); Se Hyun Ahn, Ann Arbor, MI (US)

(73) Assignee: The Regents Of The University Of Michigan, Ann Arbor, MI (US)

( * ) Notice: Subject to any disclaimer, the term of this patent is extended or adjusted under 35 U.S.C. 154(b) by 211 days.

(21) Appl. No.: 12/100,363

(22) Filed: Apr. 9, 2008

(65) Prior Publication Data
US 2009/0046362 A1   Feb. 19, 2009

Related U.S. Application Data

(60) Provisional application No. 60/910,899, filed on Apr. 10, 2007.

(51) Int. Cl.
*G02B 5/30* (2006.01)
(52) U.S. Cl. .............. 359/485.05; 264/1.31; 264/1.34
(58) Field of Classification Search ............ None
See application file for complete search history.

(56) References Cited

U.S. PATENT DOCUMENTS

| | | | |
|---|---|---|---|
| 6,518,198 B1 | 2/2003 | Klein | |
| 7,648,767 B2 | 1/2010 | Fu et al. | 428/429 |
| 7,854,864 B2 | 12/2010 | Sato et al. | |
| 2006/0159958 A1* | 7/2006 | Lee | 428/690 |
| 2007/0217008 A1* | 9/2007 | Wang et al. | 359/486 |
| 2007/0252293 A1* | 11/2007 | Sato et al. | 264/1.31 |
| 2008/0218865 A1* | 9/2008 | Iwata et al. | 359/601 |

FOREIGN PATENT DOCUMENTS

| | | |
|---|---|---|
| CN | 101432113 | 5/2009 |
| EP | 2014436 | 1/2009 |
| JP | 2005-005284 | 1/2005 |
| JP | 2007313888 | 12/2007 |
| KR | 20080113259 | 12/2008 |
| WO | WO 2006088203 A1 * | 8/2006 |
| WO | WO 2007/125857 | 11/2007 |
| WO | WO 2008/124180 | 10/2008 |

OTHER PUBLICATIONS

Ahn, S. H., et al., "Bilayer metal wire-grid polarizer fabricated by roll-to-roll nanoimprint lithography on flexible plastic substrate," J. Vac. Sci. Technol. B, vol. 25, No. 6, pp. 2388-2391 (Nov./Dec. 2007).
Ahn, S., et al., "Continuous ultraviolet roll nanoimprinting process for replicating large-scale nano- and micropatterns," Appl. Phys. Lett., 89, pp. 213101-213103 (2006).

(Continued)

*Primary Examiner* — Lee Fineman
(74) *Attorney, Agent, or Firm* — Harness, Dickey & Pierce, P.L.C.

(57) ABSTRACT

Apparatus and methods for a nano-patterning process to fabricate nanostructures. A roller type mold is used to continuously imprint nanostructures onto a flexible web or a rigid substrate. The process includes a coating and an imprinting module, which rotate the web synchronously. Liquid resist materials are used for imprinting and the patterns are set by thermal or UV curing. The process is used to produce bilayer metal wire-grid polarizers, organic solar cells, and organic light emitting diodes.

21 Claims, 22 Drawing Sheets

OTHER PUBLICATIONS

Allen, K., "Reel to Real: Prospects for Flexible Displays," Proceedings of the IEEE, vol. 93, No. 8, pp. 1394-1399 (2005).

Chu, S., et al., "Fabrication of the patterned flexible OLEDs using a combined roller imprinting and photolithography method," Proceedings of 2005 5$^{th}$ IEEE Conference on Nanotechnology, Nagoya Japan (Jul. 2005).

Ekinci, Y., et al., "Bilayer Al wire-grids as broadband and high performance polarizers," Optics Express, vol. 14, No. 6, pp. 2323-2334 (Mar. 20, 2006).

Guo, L., et al., "High-Speed Roll-to-Roll Nanoimprint Lithography on Flexible Plastic Substrates," Adv. Mater., vol. 20, pp. 2044-2049 (2008).

Guo, L., et al., "Nanoimprinted Semitransparent Metal Electrodes and Their Application in Organic Light-Emitting Diodes," Adv. Mater., vol. 19, pp. 1391-1396 (2007).

Guo, L., et al., "Organic Solar Cells Using Nanoimprinted Transparent Metal Electrodes," Adv. Mater., vol. 20, No. 23, pp. 4408-4413 (Sep. 5, 2008).

Kang, M., et al., "Nanoimprinted Semi-Transparent Metal Electrodes and Their Applications in Organic Optoelectronic Devices," MRS Presentation (Spring 2007).

Lee, H., et al., "Rigiflex Lithography for Nanostructure Transfer," Adv. Mater., vol. 17, pp. 1554-1560 (2005).

Lee, H., et al., "Simple fabrication of nanostructure by continuous rigiflex imprinting," Microelectronic Engineering, vol. 84, pp. 567-572 (Dec. 20, 2006).

Maaninen, A., "Towards R2R manufacturing of flexible displays," Presentation Apr. 5, 2006 at Society for Information Display (UK & Ireland chapter) printed on Apr. 12, 2010, http://www.sid.org/chapters/uki/presentations.html.

Mäkelä, T., "Continuous roll to roll nanoimprinting of inherently conducting polyaniline," Microelectronic Engineering, 84, pp. 877-879 (Feb. 2, 2007).

Park, et al., "Nanoscale Patterning and Electronics on Flexible Substrate by Direct Nanoimprinting of Metallic Nanoparticles," Adv. Mater., vol. 20, No. 3, pp. 489-496 (Jan. 17, 2008).

POLYMICRO Newsletter, "Reel to Reel UV Embossing," pp. 5-6 (Feb. 2003).

Rogers, J., et al., "Printing Process Suitable for Reel-to-Reel Production of High-Performance Organic Transistors and Circuits," Adv. Mater., vol. 11, No. 9, pp. 741-745 (1999).

Schift, H., et al., "Surface structuring of textile fibers using roll embossing," Microelectronic Engineering, vol. 83, pp. 855-858 (Feb. 17, 2006).

Smilgys, Russell, et al., "Progress Toward Roll Processing of Solar Reflective Material," *Proceedings of Solar Forum 2001 Solar Energy: The Power to Choose*, Washington DC, pp. 21-25 (2001).

Tan, H., et al., "Roller nanoimprint lithography," J. Vac. Sci. Technol. B, vol. 16, No. 6, pp. 3926-3928 (Nov./Dec. 1998).

Whitesides, G., et al., "Microcontact Printing with a Cylindrical Rolling Stamp: A Practical Step Toward Automatic Manufacturing of patterns with Submicrometer-Sized Features," Adv. Mater., vol. 8, No. 12, pp. 1015-1017 (1996).

Zang, H.M. et al., "Microcup® Electronic Paper by Roll-to-Roll Manufacturing Processes," Journal of the Society for Information Display, vol. 11, No. 4, pp. 621-628 (Dec. 2003).

Cheng, X. et al., "Room-Temperature, Low-Pressure Nanoimprinting Based on Cationic Photopolymerization of Novel Epoxysilicone Monomers," Adv. Mater., vol. 17, pp. 1419-1424 (2005).

Pina-Hernandez, C. et al., "High-Throughput and Etch-Selective Nanoimprinting and Stamping Based on Fast-Thermal-Curing Poly(dimethylsiloxane)s," Adv. Mater., vol. 19, pp. 1222-1227 (May 2007).

Johnson, S.C., et al., "Advances in Step and Flash Imprint Lithography," Proceedings Paper, vol. 5037, Emerging Lithographic Technologies VII, Roxann L. Engelstad, Editors, pp. 194-202 (Jun. 16, 2003).

Resnick, D. et al., "Imprint lithography for integrated circuit fabrication," J. Vac. Sci. Technol. B, vol. 21, No. 6, pp. 2624-2631 (Nov./Dec. 2003).

Resnick, D. et al., "Step & flash imprint lithography," Materials Today, vol. 8, No. 2, pp. 34-42 (Feb. 2005).

Guo, L. Jay, "Nanoimprint Lithography: Methods and Material Requirements," Adv. Mater., vol. 19, pp. 495-513 (2007).

Cheng, Xing, et al., "Room-Temperature, Low-Pressure Nanoimprinting Based on Cationic Photopolymerization of Novel Epoxysilicone Monomers," Adv. Mater., vol. 17, pp. 1419-1424 (2005).

\* cited by examiner

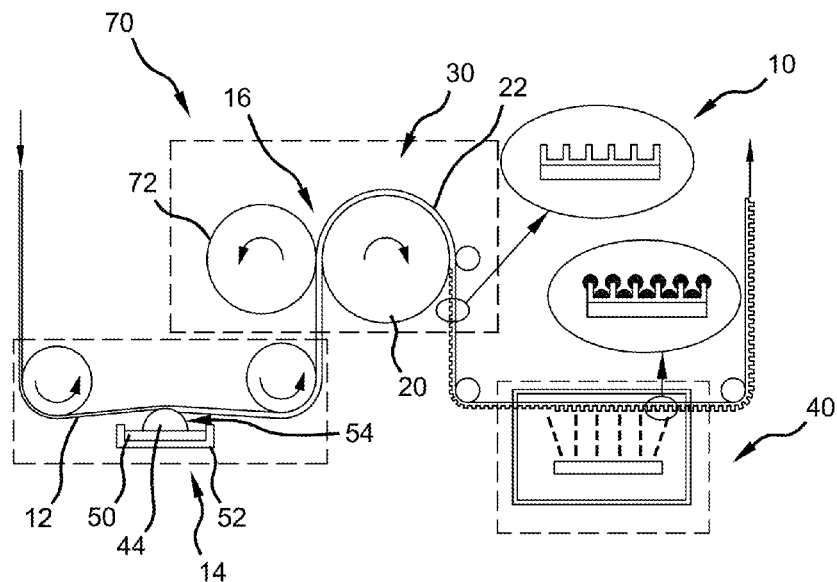
FIG. 1A
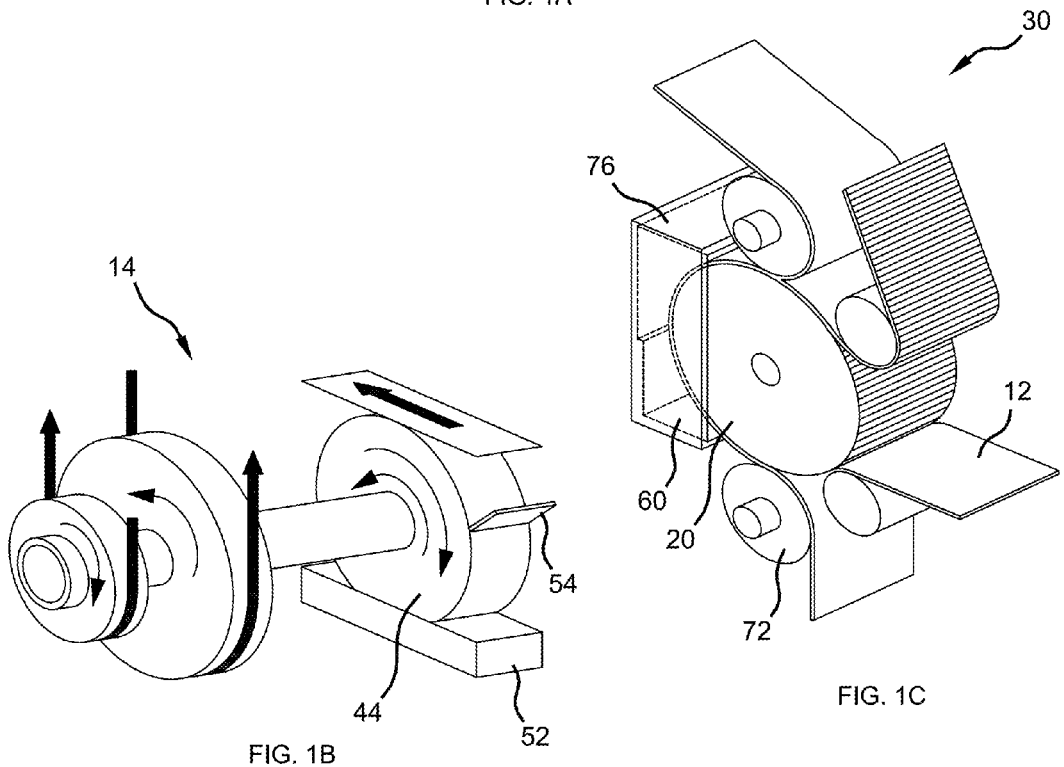
FIG. 1B
FIG. 1C

ROLL TO ROLL NANOIMPRINT LITHOGRAPHY

CROSS-REFERENCE TO RELATED APPLICATIONS

This application claims the benefit of U.S. Provisional Application No. 60/910,899, filed on Apr. 10, 2007. The disclosure of the above application is incorporated herein by reference in its entirety.

GOVERNMENT RIGHTS

This invention was made with government support under Contract No. FA9550-07-C-0012, awarded by the Air Force Office of Scientific Research (AFOSR). The government has rights in the invention.

FIELD

This disclosure relates to methods for making microscale structures, as well as devices formed therewith. More specifically, the present methods can be used to rapidly and continuously form micro- and nanostructures for use in microelectronic devices, such as metal wire grid polarizers or transparent electrodes for light emitting devices and solar cells.

INTRODUCTION

Among the various emerging techniques for nanoscale patterning, nanoimprint lithography (NIL) is a desirable technology for high-resolution nanolithography. Unlike traditional lithographic approaches that utilize photons or electrons to modify a resist material's chemical and physical properties for pattern definition, NIL relies on direct mechanical deformation of the resist materials and therefore can achieve resolutions beyond the limitations set by the light diffraction or beam scattering that are encountered in other conventional techniques. On the other hand, the current NIL process and associated throughput (e.g., about several minutes or longer per Si wafer) is still far from meeting the demands of most practical applications. There are many non-traditional microelectronics applications that require the use of nanoscale structures and demand low-cost nanopatterning technology to gain a competitive edge. However, high-speed imprinting, based on the original nanoimprint schemes, have fundamental limitations from the material and process perspectives.

Thus, there is a need for improving nanoimprint lithography processes to overcome limitations associated with the speed and cost of the process, while providing high resolution microscale and/or nanoscale structural features. The statements in this section merely provide background information related to the present disclosure and may not constitute prior art.

SUMMARY

The present disclosure includes apparatuses and methods related to a high throughput and high speed continuous processing of microscale and/or nanoscale features (referred to herein as "microscale features") using roll to roll and/or roll to plate nanoimprint lithography (R2RNIL), for example. In various aspects, the present disclosure provides a method for patterning at least one microscale feature, where the method comprises continuously imprinting a first material on a major surface of a substrate by applying pressure to the substrate and/or to a roller contacting the first material. The first material is disposed between a surface of the roller and the major surface of the substrate. The roller surface defines a pattern that forms at least one microscale feature comprising the first material on the major surface. In certain aspects, the first material comprises a polymer, a polymer precursor, and/or a metal.

In certain aspects, the present disclosure further provides a method for patterning at least one microscale feature, where the method comprises applying a first material comprising at least one curable polymer precursor to a major surface of a substrate. A surface of a roller is contacted with the major surface having the first material applied thereon. The roller surface defines a pattern that forms at least one microscale feature in the first material. At least one curable polymer precursor is cured to form a cured polymeric material defining the at least one microscale feature.

In yet other aspects, the present teachings provide a method for patterning at least one microscale feature comprising applying a first material to a major surface of a substrate. A low-surface energy roller surface is contacted with the major surface having the first material applied thereon under pressure. The low-surface energy roller surface defines an imprinted pattern that forms at least one microscale feature in the first material. Lastly, a metal material is applied over the first material to form the at least one microscale feature.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

FIG. 1(a) is schematic of a continuous process roll to roll nanoimprinting lithography (R2RNIL) apparatus to continuously fabricate at least one microscale feature on a substrate including an optional metal deposition chamber (evaporator); FIG. 1(b) shows a partial pictorial view of a coating module unit; and FIG. 1(c) is a partial pictorial view of a combined unit having an imprinting module and a curing module of the R2RNIL apparatus;

FIG. 2(a) shows a plan view of a flexible fluoropolymer, ethylene-tetrafluoroethylene (ETFE) mold fabricated from an original silicon (Si) mold; where the ETFE mold assembly is prepared as shown in FIG. 2(b) and attached to a 60 mm diameter stainless-steel roller; a soft cushion layer is placed between the ETFE mold assembly and the roller surface for conformal contact during contacting and imprinting;

FIG. 3(a) shows an exemplary coating module apparatus for conducting a continuous R2RNIL coating process in accordance with the present teachings, and FIG. 3(b) is a schematic of a reversible direction (switchable) coating device system;

FIGS. 4(a)-(b) show photographs of roll-to-roll imprinted microscale grating patterns on a polyethylene terephthalate (PET) substrate web (FIG. 4(a)) and on hard glass slide in FIG. 4(b), showing bright light diffraction from the imprinted grating structures;

FIGS. 5(a)-(e) illustrate results formed from a thermal R2RNIL process: FIG. 5(a) shows a photograph of a 700 nm period microstructural feature, 300 nm line width poly(dimethylsiloxane) (PDMS) grating pattern imprinted on a PET strip substrate by using a thermal R2RNIL process in accordance with certain aspects of the present teachings; FIG. 5(b) shows a scanning electron micrograph (SEM) of the replicated grating microstructure and UV R2RNIL results: FIGS. 5(c) and 5(d) are photographs of a 700 nm period, 300 nm line width epoxysilicone grating pattern imprinted on PET substrate in accordance with certain aspects of the present disclosure using ultraviolet (UV) radiation for curing in the R2RNIL process, showing bright light diffraction, and FIG. 5(e) is an SEM image of the replicated grating structure;

FIG. 6(a) shows an original mold comprising silicon, FIGS. 6(b) and 6(c) show UV-cured epoxysilicone gratings microstructures replicated from the ETFE mold according to certain aspects of the present disclosure; FIGS. 6(d) and 6(e) show SEM pictures of a microscale/nanoscale epoxysilicone pattern having a period of 200 nm and a line width of 70 nm line, and FIG. 6(f) is yet another epoxysilicone microscale/nanoscale pattern formed via UV curing in a R2RNIL continuous process having a 100 nm period and a 70 nm line width;

Figure 12:
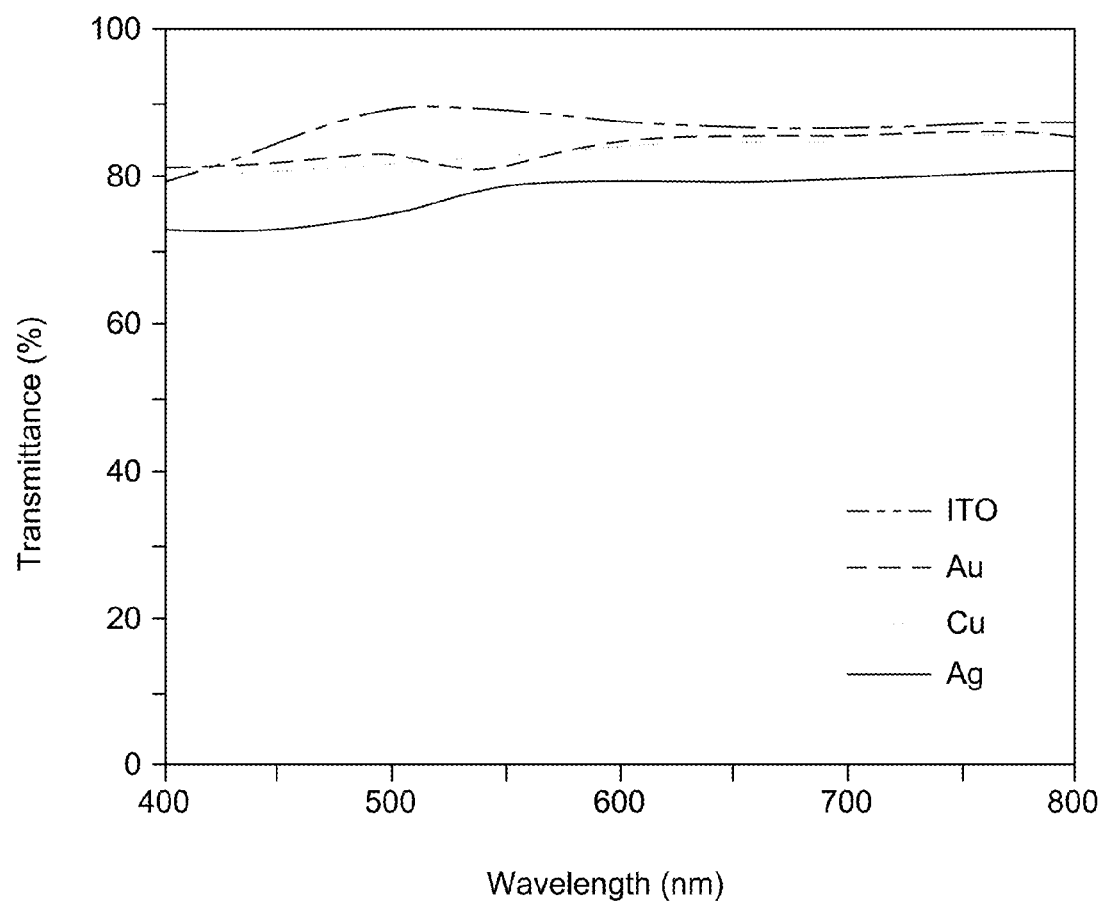
Figure 13:
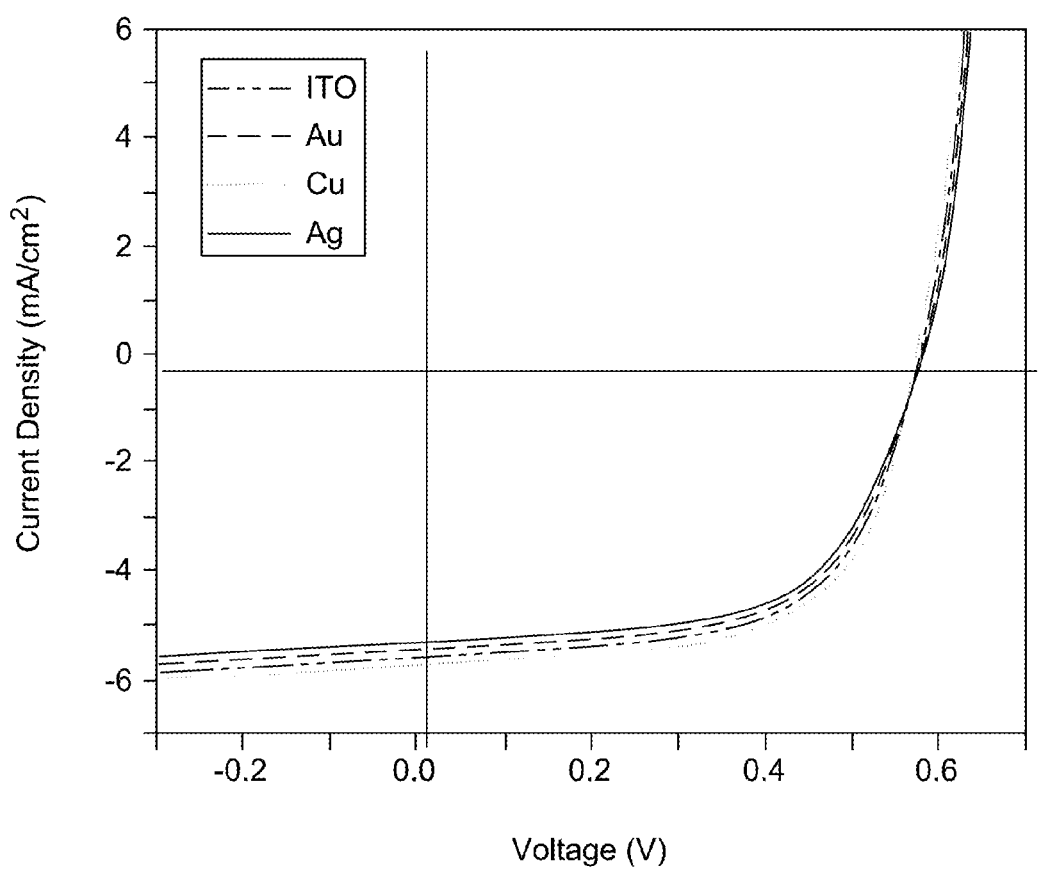
Figure 14:
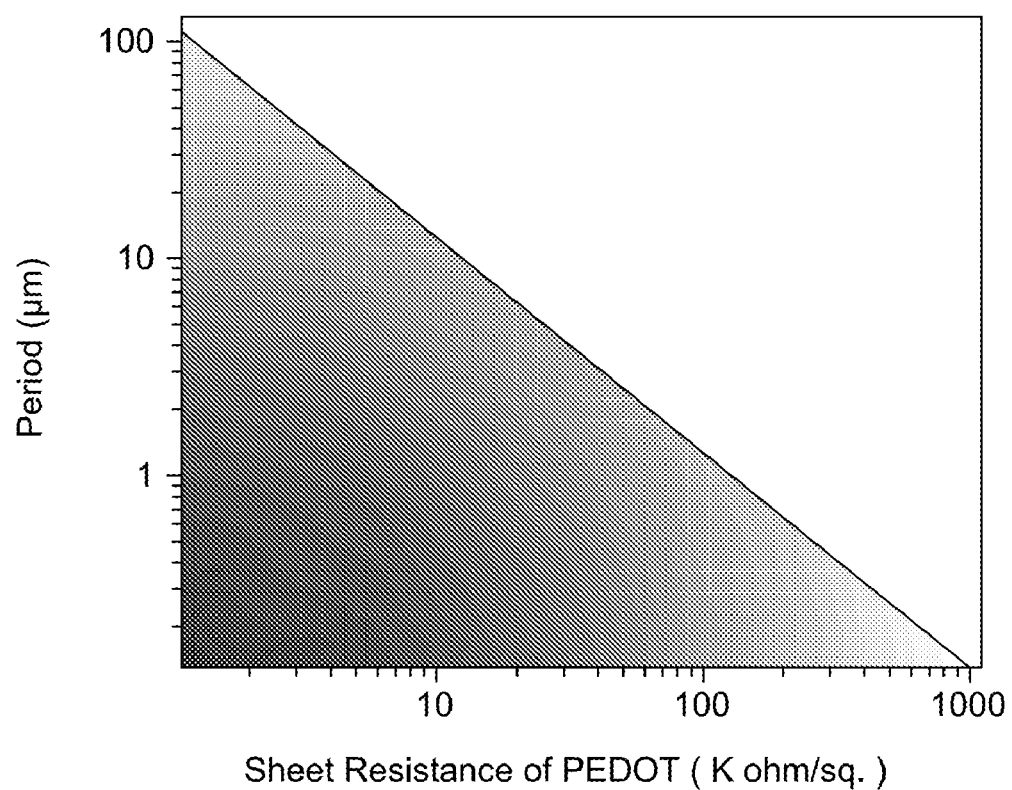
Figure 15:
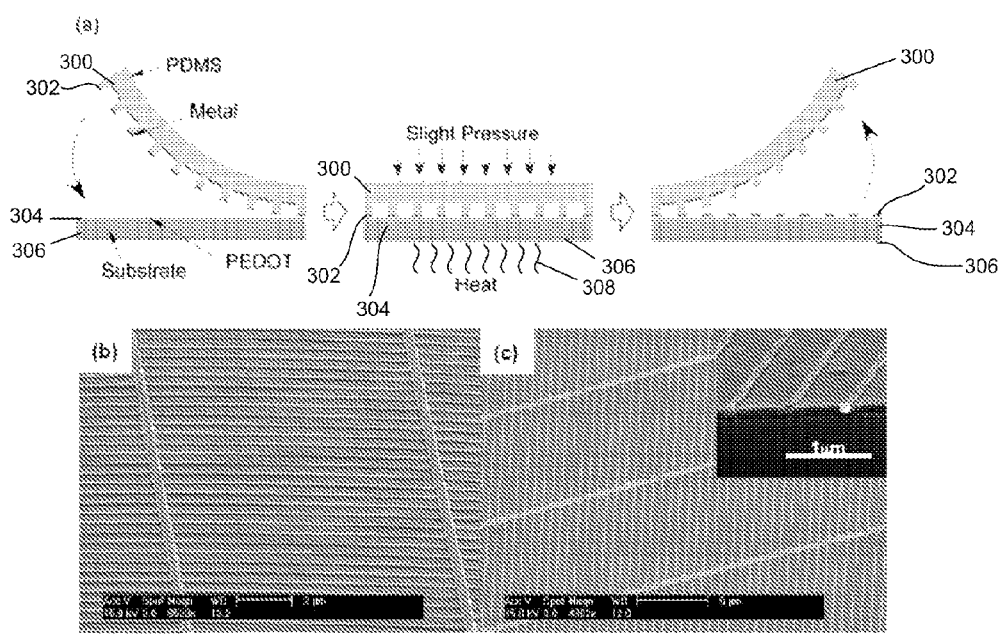
Figure 16A:
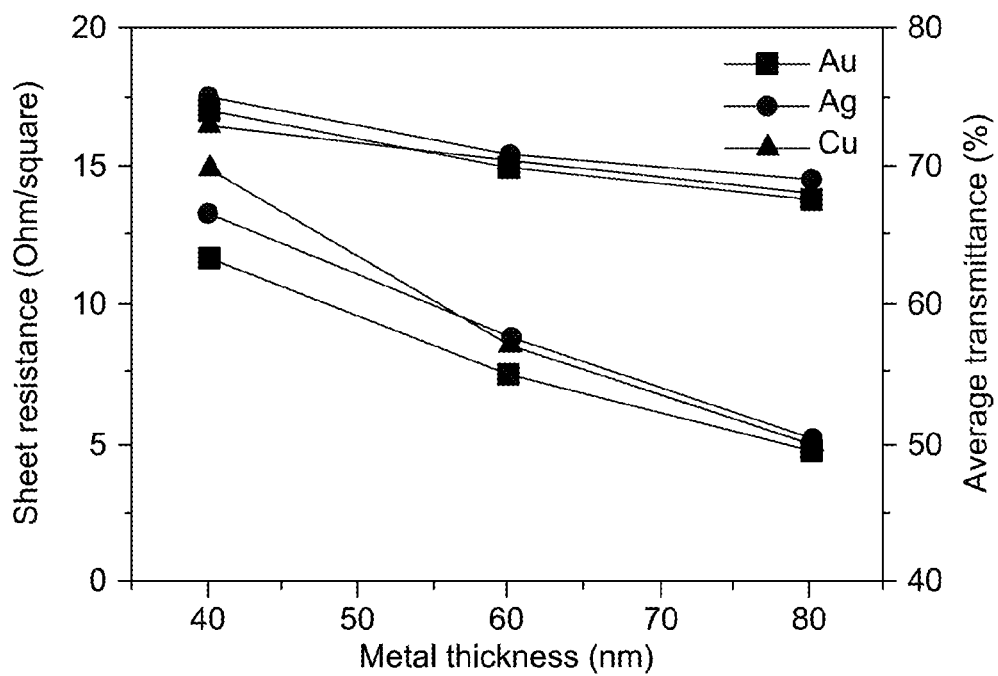
Figure 16B:
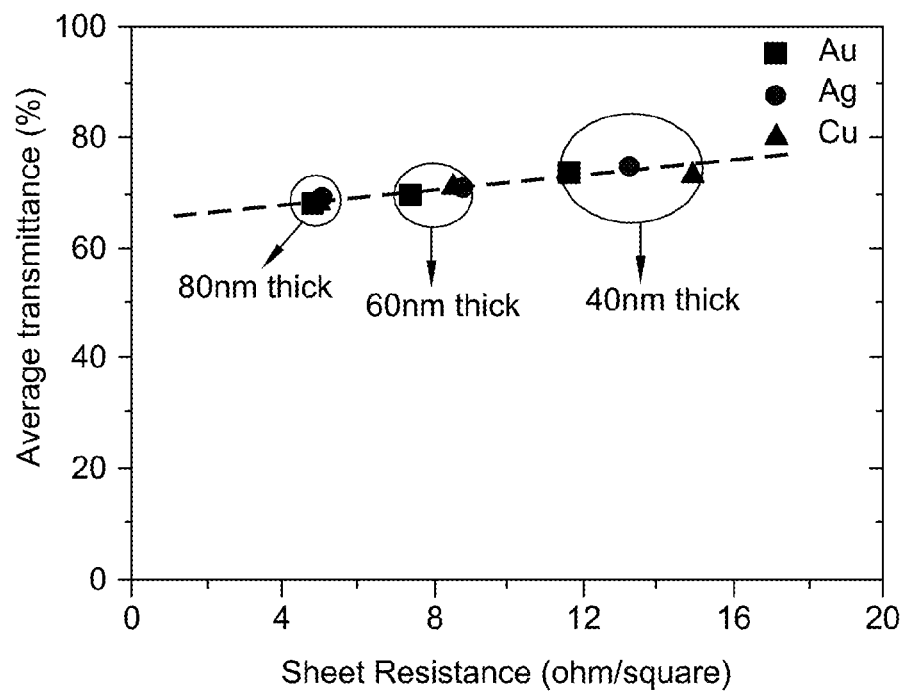
Figure 17A:
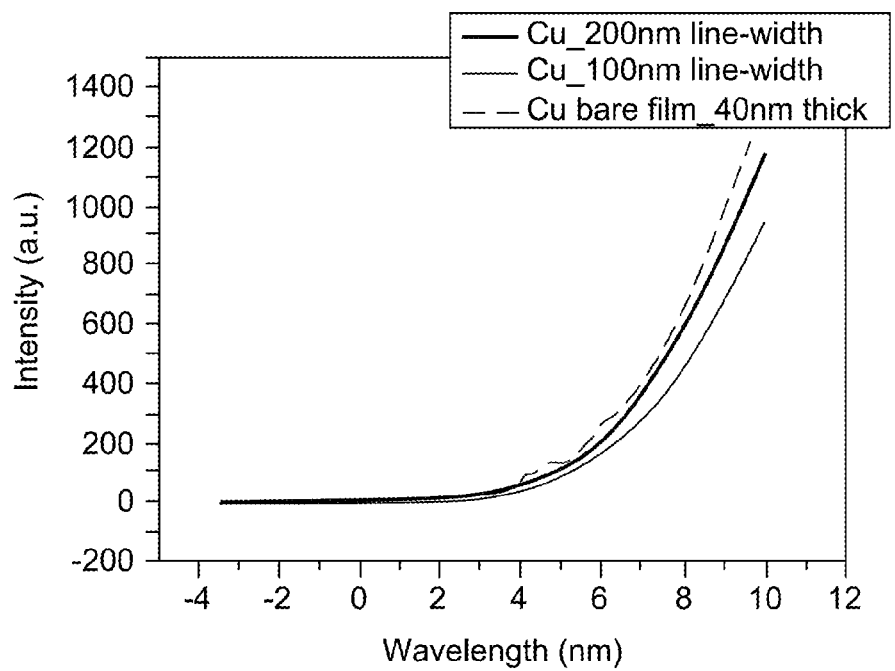
Figure 17B:
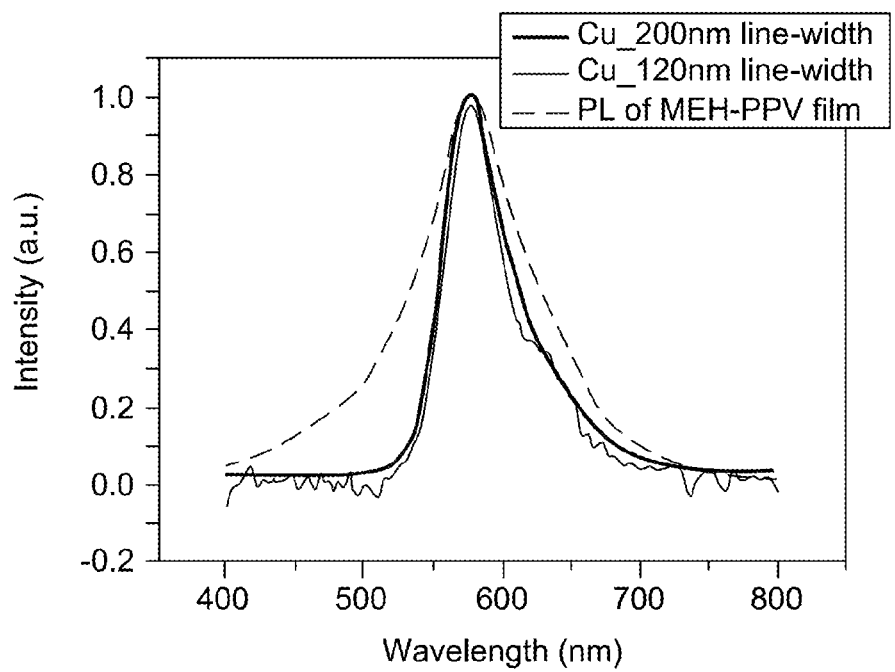
Figure 18:
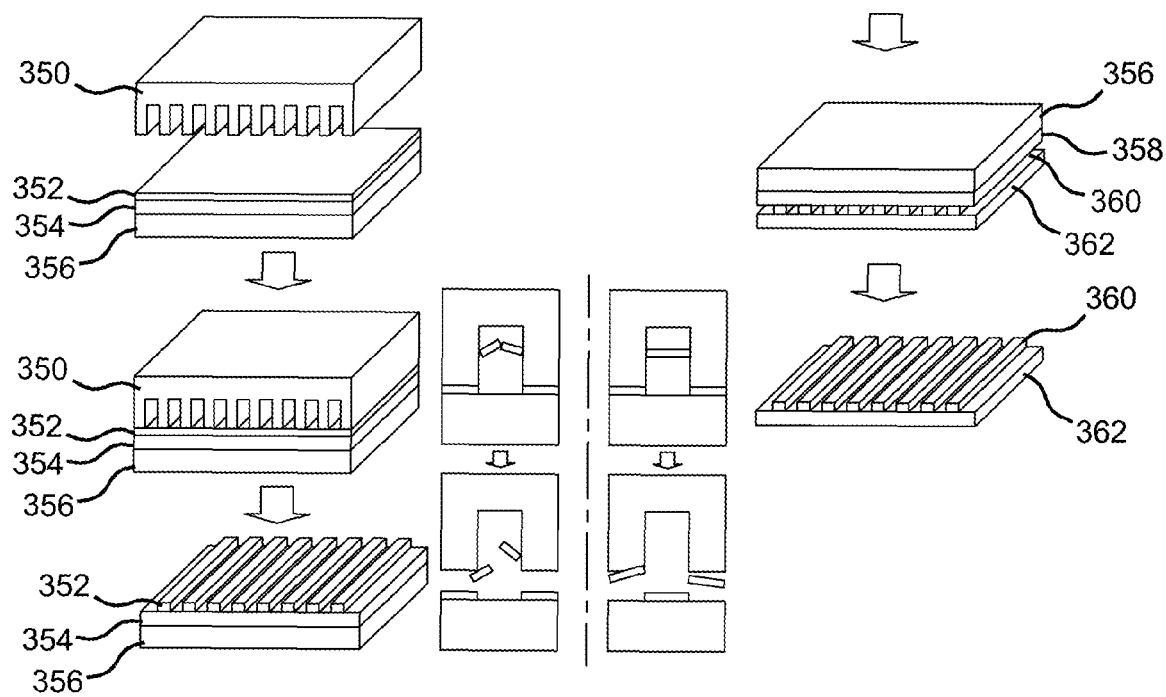
Figure 19:
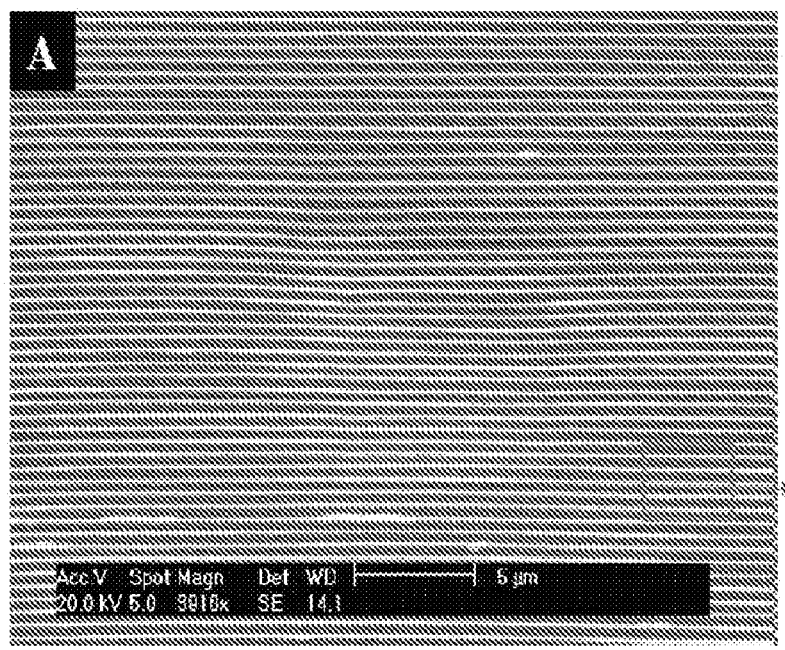
Figure 20:
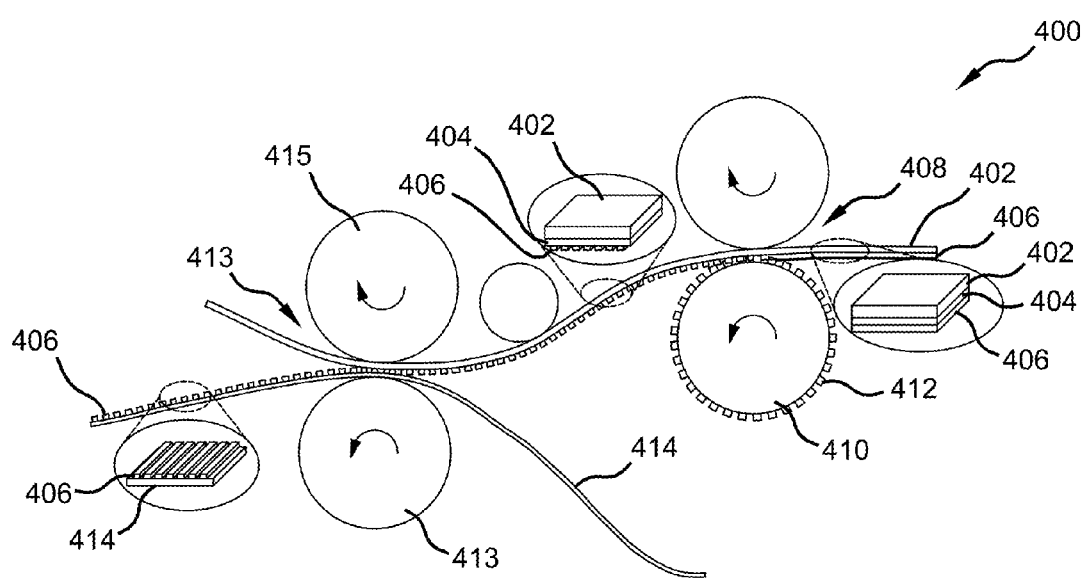
Figure 21:
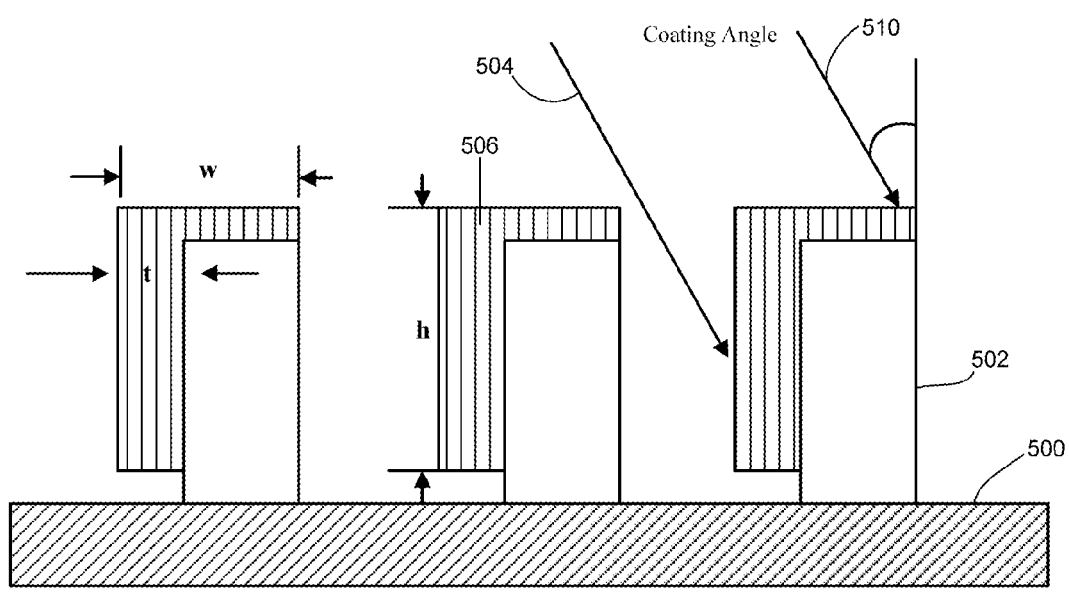
Figure 22A:
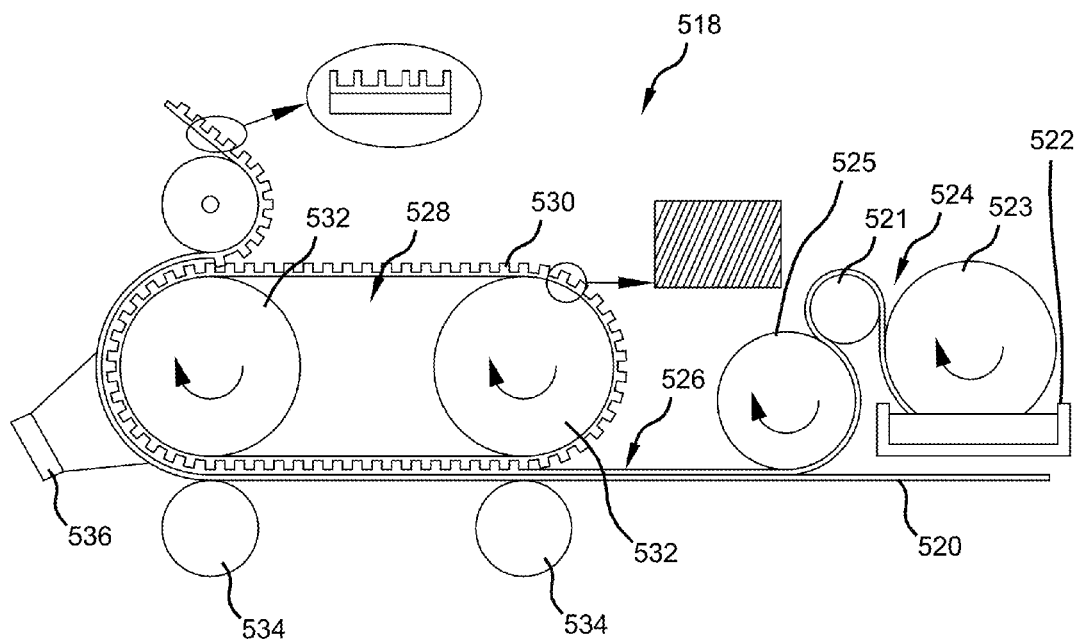
Figure 22B:
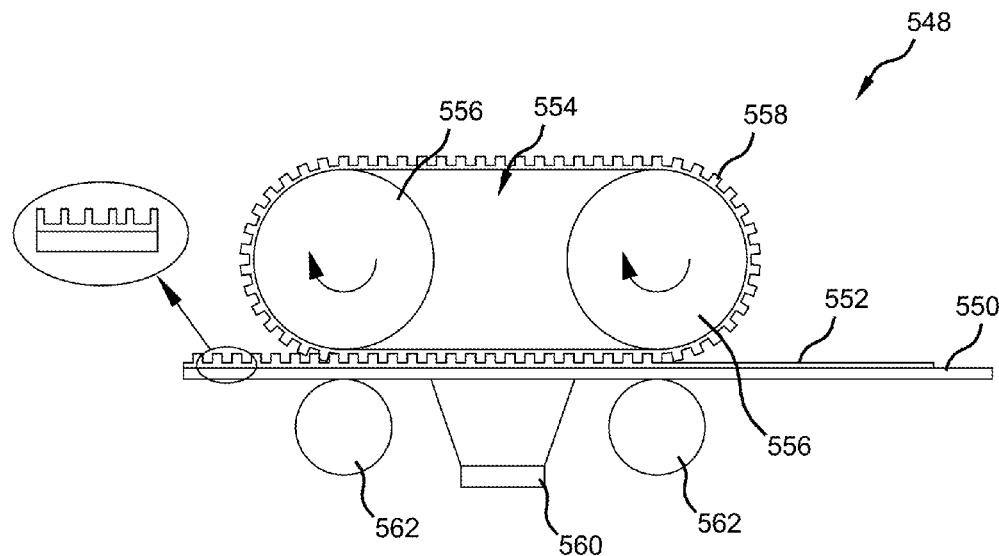

FIG. 11(a) shows an SEM image of an nanoimprint lithography mold for use in accordance with the teachings of the present disclosure having a rectangular grid pattern created by applying the nanoimprint mold surface two times, each respective imprint orthogonal to the other imprint, and FIG. 11(b) shows an SEM image of fabricated metal electrodes on a glass substrate in accordance with the present teachings;

FIG. 12 graphically depicts the optical transmittance of a nanoimprinted transparent Au, Cu, Ag, and ITO electrodes in the visible wavelength range;

FIG. 13 graphically depicts the current density versus voltage characteristics of the organic solar cells having the nanopatterned transparent Au, Cu, Ag electrodes in comparison with a conventional ITO electrode, using a solar simulator (AM 1.5 G) with an intensity of 100 $mW/cm^2$;

FIG. 14 graphically depicts a calculated appropriate period of the nanopatterned metal grating as a function of sheet resistance of the conductive polymer PEDOT:PSS, where choosing a metal grating period and a PEDOT sheet resistance within the shaded region leads to negligible loss of photocurrent;

FIG. 15(a) shows a schematic of a method of fabricating a nanopatterned metal electrode on a PEDOT:PSS-coated glass substrate by using a flexible PDMS stamp, FIG. 15(b) is an SEM image of the PDMS stamp having a 40 nm-thick deposited Cu layer on the contact surface, and FIG. 15(c) is an SEM image of the transferred Cu electrode onto the PEDOT:PSS-coated substrate, where the inset is a cross-sectional view of the transferred metal electrode formed in accordance with certain aspects of the present disclosure;

FIG. 16(a) graphically depicts a sheet resistance and average transmittance as a function of metal thickness for a 120 nm linewidth and 700 nm period metal grating and FIG. 16(b) shows an average transmittance as compared to a sheet resistance of semitransparent metal electrodes with a line width of 120 nm;

FIG. 17(a) graphically depicts a current density as compared to an applied voltage for varying copper configurations on a substrate and FIG. 17(b) shows electroluminescence characteristics of organic light emitting diodes (OLEDs) with a semitransparent Cu anode;

FIG. 18 shows a schematic of direct metal transfer process according to certain alternate aspects of the present teachings;

FIG. 19 shows an SEM image of direct metal transfer of gold lines having high pattern quality;

FIG. 20 shows a schematic of a roll-to-roll direct metal transfer application according to certain alternate aspects of the present teachings;

FIG. 21 shows a schematic of a metal material being applied to a patterned first material at an incident angle to a major surface of a substrate; and FIGS. 22(a)-22(b) show schematics of continuous processing systems according to certain alternate aspects of the present teachings, where FIG. 22(a) processes a roll-to-roll flexible substrate processed via a multi-roller transfer coating system module and a multi-roller imprinting system module and FIG. 22(b) processes a rigid substrate on a conveyor in a roll-to-plate mode, where a multi-roller imprinting system module is employed.

DETAILED DESCRIPTION

The present disclosure provides high throughput, continuous steady-state processes using certain aspects of nanoimprinting lithography in a roll-to-roll device (R2RNIL) technology to improve over conventional nanofabrication techniques. Nanoimprint lithography (NIL) achieves high-throughput and high resolution nanometer-scale patterning, which can achieve resolutions beyond the limitations set by light diffraction or beam scattering encountered in other techniques. The present R2RNIL technique inherits the high-resolution features of NIL because R2RNIL is based on a mechanical embossing approach, but further provides an increased processing nanopatterning speed by at least one or two orders of magnitude, in certain aspects. The inventive processes generally overcome the challenging problems of printing large areas of dense nanostructures encountered in a traditional wafer-scale NIL process, and further enable many new applications and processing possibilities that generally could not be realized by a conventional NIL process.

The present methods, generally referred to herein as "R2RNIL process," provide rapid, continuous patterning of large areas with microscale or nanoscale structures. In various aspects, the present teachings provide a unique solution to some of the challenges encountered in the conventional wafer-scale NIL process. In a conventional approach, printing a large area requires a very large force. A large contact area between the mold and the imprinted structures also produces a very significant (e.g., large) adhesion force, making separation between the mold surface and sample difficult or even impossible without damaging the substrate. In thermal NIL, if the mold and substrate are made from materials with different thermal expansion coefficients, such as a silicon (Si) mold and a polymer substrate, stress can build up during a thermal cycle of such a magnitude that it can damage the Si mold during mold releasing. In addition, the throughput for NIL (e.g., on the order of a few minutes per wafer) is still far from meeting the demands of many industrially or commercially practical applications, especially in photonics, biotechnology, and organic optoelectronics. In contrast, the present teachings provide an effective solution to these issues.

In various aspects, the teachings of the present disclosure provide methods of forming microscale features on a surface of a substrate in a continuous process (e.g., a steady-state process). In certain aspects, such methods enable the creation of microstructure features for creating a component of a microelectronic device, such as a polarizer or an electrode having such microstructures, for example. Thus, the phrase "electronic device" includes micro- and nano-electronic devices including one or more microscale structural features, such as, for example, micro- and nano-sized transistors, diodes, electromagnetic field polarizers, solar cells and the like. The methods of the present invention are applicable to the fabrication of various electronic devices, including, by way of example, organic thin film transistors (OTFTs), organic photo-voltaics or solar cells for solar electricity or photo-detectors, organic light emitting devices (OLEDs), organic solid state lasers or organic solid state lighting, organic thin film memory for data storage, organic sensors for bio-application and chemical detection, and optical polarizers, such as bilayer grid polarizers for light emitting applications, like those used in flat panel LCD display devices.

Thus, the disclosure provides methods of forming a structure or feature on a substrate surface that is on a microscale. In some aspects, the structure is optionally smaller than a microstructure, such as a nanoscale structure or feature. As used herein, "microscale" refers to a structure having at least one dimension that is less than about 100 µm, optionally less than about 10 µm and in some aspects, less than about 1 µm. A "nanoscale" structure or feature has at least one dimension that is less than about 500 nm (0.5 µm), optionally less than about 100 nm (0.1 µm), optionally less than about 50 nm, and optionally less than about 10 nm. As used herein, reference to a microscale, microstructure, microchannel, or microfeatures, encompasses smaller structures, such as the equivalent nanoscale structures or features, as well.

In various aspects, the present teachings provide high-throughput continuous patterning or imprinting of microstructural features on a major surface of a substrate, thus providing a commercially viable and scalable method of producing such microscale devices. The disclosure provides methods of forming a microscale structure (optionally any structure that is a microstructure or smaller) within or on a major surface of a substrate, where the microscale structure has an elongate axis, a height, and a width between features. A major elongate axis refers to a shape having a prominent elongate dimension. In certain aspects, the microfeatures of the present disclosure have desirable aspect ratios with regard to height and width dimensions of each respective microfeature structure. For example, an aspect ratio is optionally defined as AR=H/W where H and W are the height and the width of the microfeature replicated from the mold respectively. Desirably, the present teachings enable high throughput production of microfeatures having an AR of greater than about 1, optionally greater than about 3, optionally greater than about 10. In this manner, the present teachings provide the ability to provide desirably high aspect ratio structures with a desirably short period or physical distance/interval between adjacent structures.

In certain aspects, the methods of the present disclosure continuously pattern at least one microscale feature by applying a first material comprising at least one curable polymer precursor to a major surface of a substrate. Then, a surface of a roller is contacted with the major surface having the first material applied thereto. The roller surface defines a pattern that forms at least one microscale feature in the first material. In certain aspects, the roller surface is contacted with the substrate under pressure to achieve the patterning via imprinting and/or embossing of the pattern into the first material. Then, the at least one curable polymer precursor is cured to form a cured polymeric material defining the at least one microscale feature on the major surface of the substrate. In certain aspects, a metal is applied over the major surface of the substrate and overlies the cured polymeric material to thereby define the microstructural feature(s).

The substrate that is patterned is optionally either a flexible film or a rigid material. Flexible films include metal and/or polymeric films, for example, such as polyethylene terephthalate (PET). Rigid films include discrete shapes formed of rigid materials, such as silicon or glass, for example, which are conveyed to the roller surface via a conveyer system (for example, by being carried on a transfer or conveyer belt). The substrate may comprise a plurality of distinct layers. As shown in FIG. 1, a general processing system 10 optionally includes passing a substrate 12 first through a coating module 14 then a contacting or imprinting module 16 where a roller 20 having a patterned surface 22 is present and contacts the passing substrate 12, and then enters a curing module 30. In FIG. 1, the contacting module 16 and curing module 30 are combined in a single unit. Optionally, a metal application module 40 can be present after the curing module 30. In certain aspects, a pre-treatment module (not shown) is optionally present prior to the coating module 14. Such a continuous processing system is desirably provided in a so-called "roll-to-roll" configuration, where the substrate 12 travels on a web via roll or web systems through the various processing modules 14, 16, 30, and 40 (generally referred to as a nanoimprinting lithography process) to a second reel (not shown) under tension at a predetermined speed. In other aspects, the present disclosure also pertains to a "roll-to-plate" method, where the substrate is rigid and conveyed past the respective modules. In certain aspects, the continuous process is capable of patterning the substrate at a speed of at least about 1 cm/s, optionally greater than or equal to 5 cm/s, and optionally greater than or equal to 10 cm/s.

Advantages of such R2RNIL processes (in accordance with various aspects of the present teachings) over conventional NIL include the following benefits and features. First, because in R2RNIL the actual imprinting is only done in a narrow region transverse to the direction in which the web moves, a smaller force may be used to create and replicate the patterns. Second, continuous mold/web separation also occurs in a narrow region, allowing a smaller separation force. Third, since the mold used in the inventive R2RNIL processes may be in the form of a roller, it permits the separation to be done in a "peeling" fashion, which requires less force and reduces the probability of generating defects during separation. Fourth, issues due to mismatch in thermal expansion coefficients are drastically reduced or even eliminated due to the greatly reduced contact area and contact time, thereby reducing the possibility that the imprinted area separates from the roller mold without cooling.

In various aspects of the present disclosure, the concept of roller imprinting is further used as a means to improve processing speed. For example, reverse nanoimprinting or nanotransfer printing methods may be used to produce positive-tone polymer or metal patterns, which may be applied using roll-to-roll printing processes. The present disclosure provides apparatuses and methods that include high-speed roll-to-roll nanoimprint lithography (R2RNIL) on flexible substrates including various polymers or alternately on rigid substrates, such as glass. The ability to produce microscale feature patterning on various substrates provides the ability to apply such features in many new applications in the area of photonics and organic electronics. For example, the R2RNIL process overcomes the major impediments for many practical applications of patterned microstructures, namely low throughput of micro- and nano-pattern structure fabrication and the associated cost issues. For example, the present apparatus and methods using R2RNIL may be used to form bilayer metal wire-grid polarizers, organic solar cells, and organic light emitting diodes. These structures may be used in a variety of applications, including for example, silicon (Si) electronics, organic electronics and photonics, magnetics, and biological applications.

In certain aspects, the methods of the invention include applying a first material to the substrate as a liquid or a semi-solid. In certain aspects, where the first material is a liquid, the application method can include ink jetting, spraying via nozzle application and/or by gravure application methods or other suitable methods known to those of skill in the art. In a gravure application process, such as those shown in FIGS. 1 and 3a-3b, one or more coating rollers 44 in the coating module 14 contacts the first material 50 in a vat 52, optionally passes by a doctor blade 54 to uniformly distribute the desired amount of first material 50, on the coating roller 44, and then contacts and coats the passing substrate 12, thus applying the first material 50 to a major surface of the substrate 12 in a liquid form. The amount of first material (e.g., resist) can be adjusted by the doctor blade 54 fixed in a two-DOF stage (e.g., linear, tilting). In certain aspects, the first material 50 is a liquid having a viscosity of less than about 10 Pa·s, optionally about 0.01 Pa·s to about 10 Pa·s. Where the first material 50 is a semi-solid or solid, it is preferably heated prior to application to provide the desired coverage and thickness of the first material on the major surface of the substrate 12. While the desired first material 50 thickness is dependent upon the final application and is not limited to the following thicknesses, in certain exemplary aspects, the first material layer 50 is applied at a thickness of greater than or equal to about 0.1 µm to less than or equal to about 10 µm. Also, it should be noted that multiple layers of the first material or distinct materials may be applied to the substrate in accordance with various aspects of the present disclosure. In certain other aspects, the present disclosure further contemplates embodiments where the first material is a polymer material disposed on the substrate, for example, as a coating or a layer, and is imprintable when subjected to a patterned surface under pressure and/or heat, but may not require curing or may already be in a cured or crosslinked form.

Next, the coated substrate 12 passes into the contacting module 16, where one or more pattern rollers 20 (shown in FIGS. 1 and 3 as a single roller) have a surface pattern formed therein. As will be described in more detail in the context of FIGS. 22a-b, the coating and contacting modules may employ any number of roller systems known in the art to achieve the desired effect and are not limited to the exemplary embodiments shown in the present disclosure. The patterned surface 22 is contacted with the passing substrate 12 at a contact region and thus a microstructure is formed in the first material (generally in a liquid and/or gel form) by the patterned surface 22 of the contact roller 20. In accordance with certain principles of the present disclosure, the surface 22 of the pattern roller 20 has a relatively low surface energy that enables the continuous formation of microstructural features without damage (for example, discretely forming the desired features, by removing portions of the first material while leaving remaining regions of the first material in the desired predetermined microstructural features regions). In certain aspects, the roller surface 22 has an average low-surface energy of less than or equal to about 50 dyne/cm; optionally less than or equal to about 25 dyne/cm; optionally less than or equal to about 15 dyne/cm; and in certain aspects, less than or equal to about 10 dyne/cm. The roller surface 22 may be formed of a low surface energy material or may be treated to achieve such a desired low-surface energy. By way of example, the roller surface 22 may comprise a polymer material, such as fluoropolymers like polytetrafluoroethylene (PTFE), ethylene tetrafluoroethylene (ETFE), or polydimethylsiloxane (PMDS). Alternately, the roller surface 22 comprises a metal material, such as nickel or a nickel alloy and may be formed as a surface layer over a metal (e.g., stainless steel barrier). In certain aspects, the roller surface 22 comprises ETFE. In certain aspects, the present disclosure provides methods of forming patterned rollers, which will be discussed in more detail below.

In various aspects, the contact pressure achieved by the contact roller 20 depends upon the substrate 12 properties, the properties of the coated first material 50 (and adhesion achieved between the first material 50 and the substrate 12, as compared to the adhesion with the surface 22 of the contact roller 20), the size, density, and complexity of the microstructural features, the speed of the substrate, and the like. Further, the current methods provide desirable additional control of formation of the microstructure features in the contacting module, by controlling the pressure exerted to the substrate by web tensioning, back-up rollers, or a combination thereof, as discussed in more detail below. In certain aspects, the respective modules are synchronized together by an actuating apparatus, such as a step motor.

As noted above, in certain aspects, the first material comprises one or more curable polymer precursors, such as monomers or oligomers. By "curable" it is meant that the polymer is capable of undergoing a polymerization reaction when exposed to certain forms of energy, such as heat and/or actinic radiation (such as UV irradiation). Curing reactions can be initiated by activation of a curing agent species and can proceed by a cationic route or a free radical route, for example. Thus, curing occurs in the curing module 30 (FIGS. 1(a) and (b)) and is accomplished by applying thermal energy and/or actinic radiation energy to the passing substrate 12, for example, by an energy source 60, such as an oven, heat lamp, heat gun, UV radiation lamp, and/or the like to achieve curing of the first material 50 on the major surface of the substrate 12. In this manner, the first material 50 is optionally cured to a solid form on the substrate surface. In certain aspects, the first material comprises an epoxy precursor, epoxysiloxane precursor or negative tone photoresist precursor, which undergoes UV radiation curing. For example, a suitable commercially available resist is SU-8, a negative tone photoresist high contrast epoxy based material available from MicroChem of Newton, Mass. In certain aspects, the first material comprises a polydimethylsiloxane (PDMS) precursor, which undergoes thermal radiation curing.

As noted above, a metal application module 40 is optionally further provided, where at least one metal or a material comprising a metal is applied over the cured polymeric material on the major surface of the substrate 12, thus forming the at least one microscale feature formed via the cured polymeric material overlaid with the metal material. The metal material can be applied by a variety of suitable processes, including at least one process selected from: chemical vapor deposition, physical vapor deposition, shadow evaporation, and sputter deposition. While the desired metal depends upon the end-use application, the metal material optionally comprises a metal element selected from the group consisting of gold, platinum, silver, copper, aluminum, chromium, nickel, titanium and mixtures and alloys thereof. In certain aspects, the metal material is applied at a thickness of about 10 nm to about 1 µm.

In certain aspects of the present disclosure, the at least one metal is applied normal to the major surface of the substrate (generally orthogonal or at a 90° angle). However, in other aspects of the disclosure, the metal material is optionally applied at an angle incident to the major surface, for example, at a 45° angle formed between the metal source and the major surface. By way of example, FIG. 21 shows such a configuration. As shown in FIG. 21, a first material 502 is patterned on a major surface of a substrate 500. A metal material source applies metal in the deposition chamber from a direction 504. The direction 504 forms an incident coating angle 510 with respect to the major surface of the substrate 500. In this manner, metal 506 is selectively applied to the first material 502 along an upper surface as shown by width "w," a height "h" (where notably due to the coating angle a gap is optionally left between the substrate surface 500 and metal film 506). The metal film is applied to a thickness of "t," although thickness gradients may be designed based on moving the location and incident coating angle 510 of the metal source 504 and/or with use of various layers. It should be noted that incident coating angles of application (between a metal source and the major surface of the substrate) are not limited to the angles shown or described herein, and any variety of incident angles for metal application are contemplated herein.

In other aspects, the present disclosure provides a method for patterning at least one microscale feature in a continuous process by a method that includes applying a first material to a major surface of a substrate. Then contacting a low-surface energy roller surface under pressure with the major surface that has the first material applied thereon. The low-surface energy roller surface defines an imprinted pattern, which will create at least one microscale feature in the first material, upon contact and application of pressure between the roller surface and the substrate. Then a metal material is applied over the first material, thereby forming the at least one microscale feature. In certain aspects, the substrate comprises a multilayer structure, such as substrate that comprises a first layer comprising silicon and a second layer comprising silicon dioxide. In such a method, the first material optionally comprises a polymeric material, such as commercially available MRI-80520 resist sold by Microresist Technology GmbH of Berlin, Germany or a conductive polymer, such as polystyrene sulfonate-doped poly(3,4-ethylenedioxythiophene) (PEDOT/PSS), polypyrrole, polyaniline, or a organic semiconductor such as poly(3-hexylthiophene) (P3HT), pentacene and mixtures thereof. It should be noted that in this embodiment or other embodiments, the first material optionally comprises a plurality of materials, and may include particles, such as conductive nanoparticles distributed therein. In certain aspects, the first material may be cured during processing in the continuous reel-to-reel process, for example, or may be preformed on the surface and then introduced to the processing modules (thus omitting a coating module). In such an embodiment, the curing module may also be omitted. The first material may be applied by any variety of known methods, preferably by continuous methods for use in a processing module, such as gravure coating, nozzle-jetting, or spin-coating. The metal material can be applied by any of the metal application methods described above, for example, by vapor deposition or sputter deposition. In certain aspects, the metal material comprises chromium and the exposed surfaces are etched prior to metal deposition.

In another aspect of the disclosure, a method is provided for patterning at least one microscale feature on a substrate. The method comprises continuously imprinting a metal on a major surface of a substrate by a roller. A metal material is disposed between a surface of a roller and the major surface of the substrate. In certain aspects, the metal material is a thin layer or thin film having a thickness of less than or equal to about 10 µm and optionally less than or equal to about 1 µm. Pressure is applied to the roller and/or surface to define a pattern on the major surface that defines at least one microscale feature having the metal disposed thereon. Thus, in certain aspects, the substrate comprises a polymeric layer and the metal material is provided on the roller surface prior to contact. In certain aspects, the metal layer is patterned optionally on a transfer substrate and then transferred to the final substrate via a continuous imprinting process. The continuous imprinting further comprises applying heat to the substrate to transfer and adhere the metal thereto in the pattern corresponding to the contact roller.

In certain aspects, such as that shown in FIG. 18, a direct metal transfer method is shown, where a metal layer 352 is coated or provided on a cushioning layer 354 (for example, made of silicone rubber or PMDS) disposed on a substrate 356. A rigid mold 350 is contacted with the metal layer 352, cushioning layer 354, and substrate 356 under pressure to form a pattern therein upon removal of the mold 350. As can be seen in the insets, the mold 350 interacts with the cushioning layer 354 enables fracturing of the metal at a relatively low pressure to form a pattern in the metal layer 352. The metal layer 352, cushioning layer 354, and substrate 356 are then optionally contacted with another substrate 362, optionally in the presence of heat and/or pressure, where the patterned metal layer 352 forms microstructures on the substrate 362. FIG. 19 shows a device made with gold microstructures on a substrate via a direct metal transfer process according to the present teachings.

In FIG. 20, yet another direct metal transfer process is shown, where the method includes passing a flexible transfer substrate 402 having an intermediate cushioning layer 404 and a metal layer 406 on a contact surface. A metal pattern can be formed via mechanical fracture/cracking to emboss or imprint the pattern, without the need for curing or coating processes. The transfer substrate 402, cushioning layer 404, and metal layer 406 enter a first contact zone 408 having an imprinting rollers 410, one of which has a patterned surface 412 for continuously embossing a pattern into the passing metal layer 406. The patterned metal layer 406, cushioning layer 404, and transfer substrate 402 pass from the first contact zone 408 into a second contact zone 413. A second substrate 414 is also simultaneously fed to the first contact zone 408 and the transfer substrate 402, cushioning layer 404, and patterned metal layer 406 are contacted with the second substrate under pressure and optionally heat via contact rollers 415. In the second contact zone 408, the metal layer 406 is transferred to the second substrate 414, thus forming the desired microstructure pattern thereon via a continuous imprinting process.

Thus, the present disclosure provides methods of forming various microstructural features with various sizes, orientations, shapes, and configurations. In certain aspects, a first grating (e.g., grid or mesh pattern) is formed on a major surface of the substrate having a first orientation. In one example, such as that shown in FIG. 7, a grating pattern is formed in a first material layer 200 over a substrate 202 having a major surface 204, where there is a first lower exposed surface 206 (formed by compression or removal via protrusions in the pattern surface) and a second upper exposed surface 208 (e.g., formed via grooves or voids in the pattern surface). Where a metal film 210 is applied over the first lower and second upper exposed surfaces 206, 208, a distance "d" is formed between the lower metal surface 212 and the upper metal surface 214.

Figure 7:
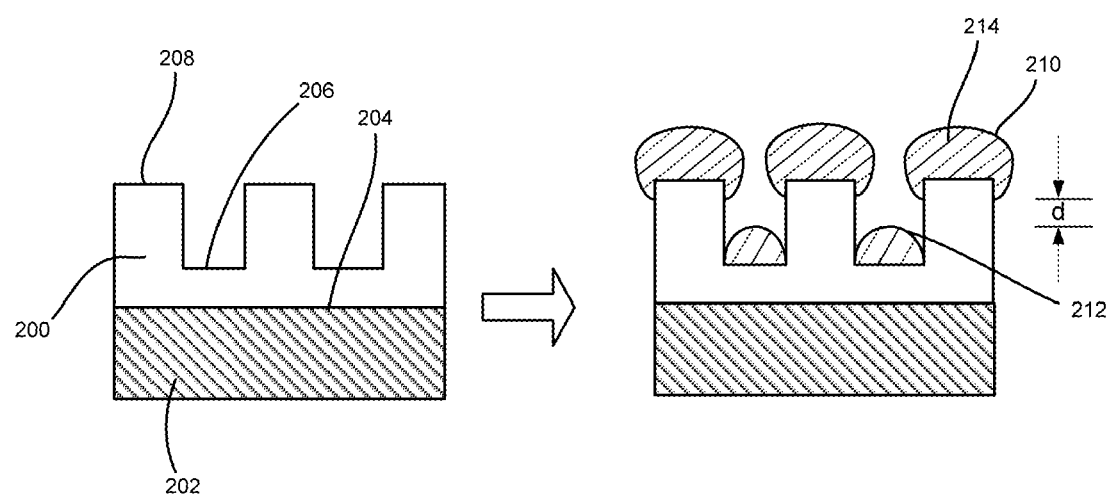
FIG. 7 is a schematic of a fabrication process for a metal wire-grid polarizer.
Figure 8A:
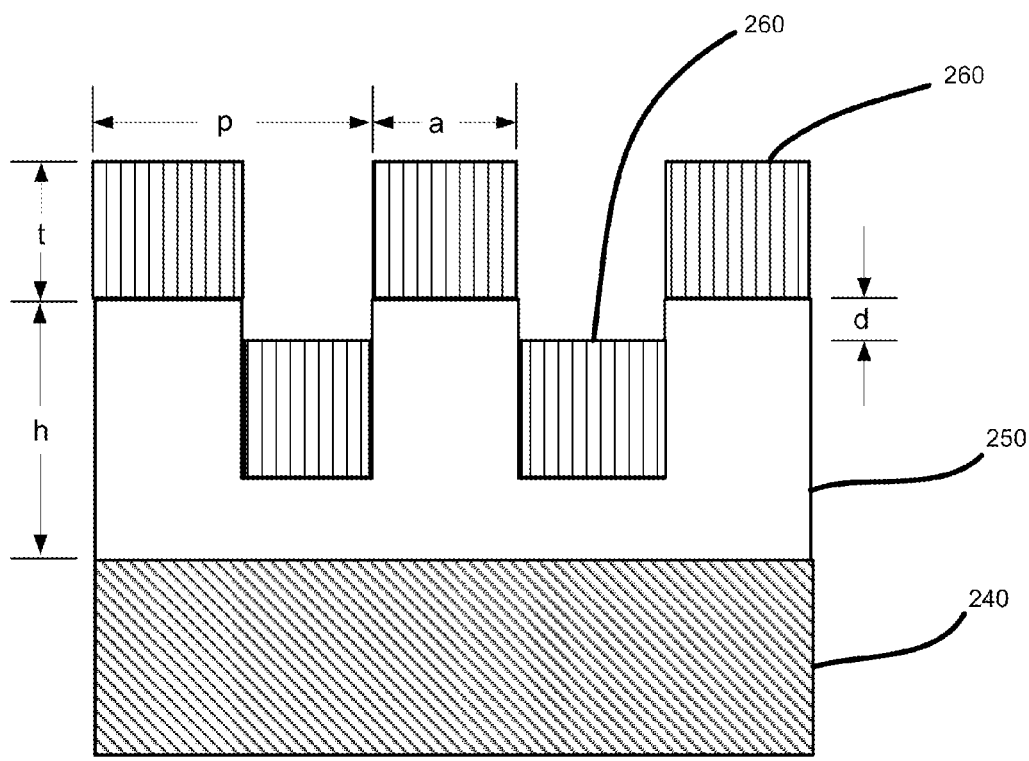
FIG. 8(a) is a schematic of a metal wire-grid polarizer formed by the process of FIG. 7, including depositing metal on top of the roller imprinted polymer grating microstructure.
Figure 8B:
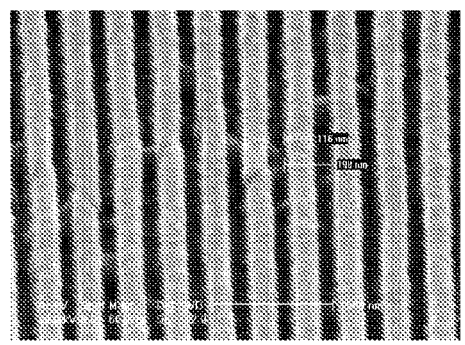
FIG. 8(b) is an SEM image of a microstructural grating pattern having a period of 200 nm and a 50 nm thick layer of aluminum (Al) on top.

In another aspect, FIGS. 8a and 8b show a bilayer grid pattern on a substrate 240 with a period "p," a first material layer 250 height "h," a width of the first material layer 250 of "a," and a metal layer 260 having a thickness "t." Separation between the layers is defined by the thickness of the first material layer 250 and the metal layer 260, represented by d=h−t. The first material layer 250 duty cycle is defined by f=a/p. Such configurations as those shown in FIGS. 7 and 8 create a device that is suitable for use as a bilayer electromagnetic wave polarizer grid, for use in conjunction with LED devices, for example.

In this manner, various multilayer surfaces can be formed according to the present disclosure in a variety of patterns (not limited to exemplary bilayer structures). In various aspects, the methods of the disclosure can be used to form such wire grid polarizers having at least one microscale feature that defines a multi-layer grating structure or grid on a major surface of the substrate. Such grating microstructures can have a variety of different shapes tailored to the end application, by way of example; a suitable wire grid polarizer has a period (i.e., interval/distance between a first feature and a second feature, see FIG. 8, for example) of less than about 1 µm suitable for polarizing electromagnetic energy waves in the visible (wavelength ranging from about 400 nm to about 800 nm) to near-IR (wavelengths ranging from about 1 µm to about 10 µm).

In other aspects, a plurality of patterns can be formed on the major surface, for example, by a single contact roller or by successive contact with contact rollers having distinct patterns. For example, a first grating pattern has a first orientation that is generally orthogonal to a second grating pattern having a second orientation. For example, an angle of about 90° is formed between the first orientation and the second orientation (although other angles are contemplated), thus, the microscale feature defines a rectangular grid on the major surface that can be used as an electrode, for example. Thus, a semi-transparent or transparent electrode for an electronic device can be formed in accordance with the present methods to form at least one microscale feature defining a first grating structure having a first orientation and a second grating structure having a second orientation with respect to the major surface of the substrate, wherein the first orientation is disposed at an angle to the second orientation.

In certain aspects, the substrate is optionally pretreated prior to the applying the first material to enhance adhesion of the first material to the major surface. For example, an adhesion promoter may be applied to the substrate surface, such as those well known to those of skill in the art, such as alkoxysilanes or aminoalkoxy silanes, including commercially available adhesion promoters, such as Silquest® silane from GE Advanced Materials of Wilton, Conn. In other aspects, the substrate may be treated to etch the surface, via physical roughening, chemical and/or plasma treatment. In certain aspects, plasma etching (e.g., corona-treatment) is particularly suitable for increasing the adhesion of the first material at the surface of the substrate.

With reference to FIG. 1, a suitable configuration for a continuous R2RNIL nanomanufacturing process is shown. The process can be divided into three separate processing steps: 1) a coating process, 2) an imprinting and separating process, and 3) any subsequent process, which in the case of wire-grid polarizer includes a film deposition over the imprinted nanostructures. The apparatus of FIG. 1 illustrates the first two process steps of the present methods, while material deposited in the third or subsequent steps may not be shown, can may be carried out using separate apparatuses or processing modules in line with the R2RNIL apparatus, as appreciated by those of skill in the art. As discussed above, the schematic of the R2RNIL process in FIG. 1a includes three subsystems for (A) continuous coating, (B) R2R imprinting, (C) vacuum deposition, as labeled.

Figure 2A:
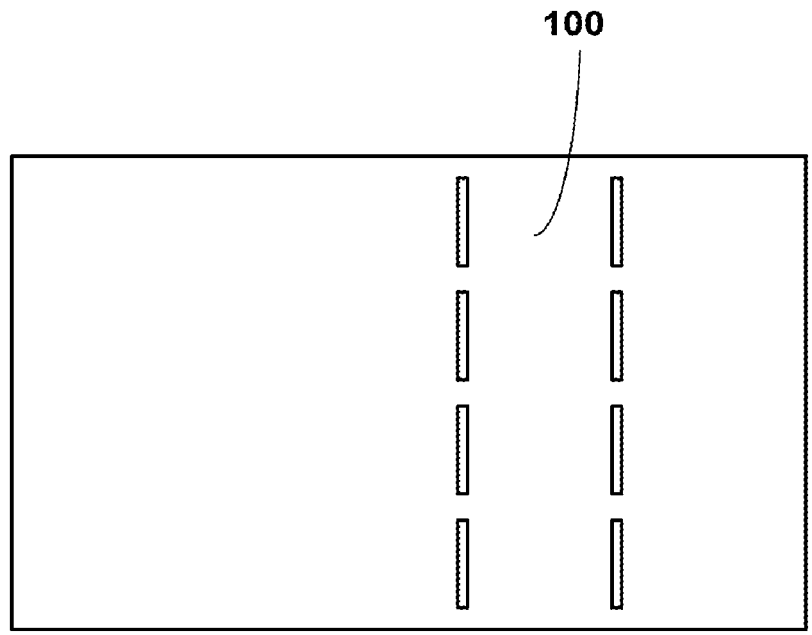
Figure 2B:
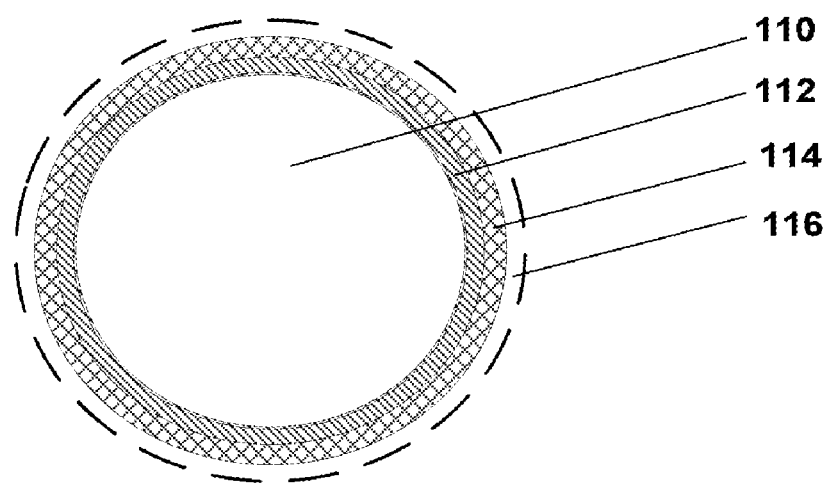

Methods of the present disclosure using roll-to-roll nanoimprinting (R2RNIL) can be technically challenging by requiring a complete set of solutions to address a number of interrelated material issues. First, a special roller mold is typically required for continuous roll-to-roll imprinting of nanostructures. Molds used in R2RNIL should be flexible enough to wrap onto a roller surface, and they should also have sufficient modulus and strength to imprint other materials. As shown in FIGS. 2a and 2b, a mold surface is created from a silicon master 100 having microscale features formed therein. By way of example, a relatively large-area Si master mold 100 may be fabricated by laser interference lithography to create the microscale features. From this master 100, a flexible mold contact surface 116 is formed, which can be wrapped around a contact roller 110. For example, the mold material 116 may be a flexible material, such as the flexible fluoropolymer, ethylene-tetrafluoroethylene (ETFE). ETFE has a high modulus (about 1.2 GPa) at room temperature, but can be softened at elevated temperatures. An ETFE mold can be easily replicated (FIG. 2) from an original Si mold 100 by a thermal NIL process at 220° C. Such a flexible contact material 116 optionally includes a substrate 112 that adheres to a surface of the roller 100 and may optionally have a cushioning layer 114. Moreover, anti-sticking properties of ETFE are particularly beneficial (surface energy of 15.6 dyne/cm, poly(dimethylsiloxane) (PDMS) has a surface energy of about 19.6 dyne/cm) makes it easy to demold after imprinting without any mold surface treatment and without deterioration in surface properties over long imprinting cycles. A low surface energy allows for clean mold release. In addition, the roller mold should be durable under continuous imprinting. Continuous material or several pieces of ETFE may be used to form a mold 116 over roller 110. Where several pieces of ETFE are used, the pieces are replicated, wrapped, and fixed to a 60 mm diameter stainless steel roller, for example. If a higher surface energy material is selected for use as the mold material 116, it is advantageous to treat the surface to reduce surface energy and/or enhance the releasability of the material.

Suitable mold materials 116 ideally have relatively low surface energy and therefore may not require additional surface treatment, such as a non-stick mold release spray or other surface treatments. If a higher surface energy material is selected for use as the mold material 116, it is advantageous to treat the surface to reduce surface energy and/or enhance the releasability of the material.

For a fast roll-to-roll process, there are several additional parameters to consider in selecting the first material. First, a liquid resist having good coating properties is preferred because it can be continuously and uniformly coated onto a substrate (e.g., a plastic substrate) and is easily imprinted with low pressure, for example at pressures of 0.1 MPa or less. Second, in certain aspects, the liquid resist should have a relatively low viscosity before curing to allow fast imprinting. Third, a first material used in certain embodiments of the present methods should have the ability to be rapidly cured and minimize shrinkage after curing, in contrast to many conventional resist materials, which are less suitable due to being dissolved in solvents, requiring additional baking processes, and for certain thermoplastic materials, requiring very high pressures and relatively long processing times to complete the imprinting.

In certain aspects, the first material is referred to herein as a "resist" material, as known in the art. Such materials are generally selected to satisfy one or more of the following criteria. First, it is desirable to use a solvent-less formulation to avoid solvent evaporation and bubble generation during the imprinting process. If the polymer or polymer precursor components are dissolved in a solvent, the distance between the coater and the imprint roller should be selected so as to allow sufficient solvent evaporation. Second, the thickness of the first material coating should be optimized to balance the imprinting speed and the material cost. Third, the first material is selected to have sufficiently low viscosity to ensure easy filling of mold cavities, as previously discussed above and in certain embodiments, less than about 10 Pa·s, and preferably less than 0.1 Pa·s. Based on these requirements, two examples of suitable first materials for the R2RNIL process include (1) fast thermal curable (PDMS) and (2) UV curable epoxysilicone liquid resist.

A suitable type of first material liquid resist for R2RNIL applications is a thermal-curable liquid resist based on a modified PDMS. Such a first material resist includes four chemical components: a vinyl terminated polydimethylsiloxane polymer, a silyl-hydride (Si—H) based dimethylsiloxane crosslinker, a platinum catalyst, and an inhibitor. The inhibitor is optionally an unsaturated organic ester that keeps the catalyst inactive until the application of heat, which quickly deactivates the inhibitor and releases the catalyst in its active form. The low-viscosity liquid resist can quickly fill into the cavity features on the mold surface using web tension and the pressure from the backup rollers. The material can be crosslinked within a few seconds or faster at a temperature of about 120° C. because of the rapid deactivation of the inhibitor. The fast crosslinking ensures high-speed patterning in accordance with certain aspects of the present teachings.

In certain aspects, processing speeds can be further increased by optionally including a first material comprising a UV-curable low viscosity liquid epoxysilicone. Different from the acrylate-based resists often used in UV-assisted NIL process such as step-and flash imprint lithography (S-FIL), epoxysilicone is cured via a cationic curing mechanism, thereby free from any oxygen sensitivity issues when exposed in air. Thus, no special vacuum environment is required, which is convenient for the roll-to-roll process. Furthermore, the low shrinkage of the epoxysilicone after curing (only a fraction compared to certain acrylate resists) allows for reproducible and consistent pattern replication. Owing to its low viscosity, the resist polymer precursor can be imprinted at low pressures and cured within seconds, or optionally in less than one second by focused UV light, for example, to form a polymer material. UV curable epoxysilicone liquid resist may have a viscosity of about 0.032 Pa·s. Various resists having viscosities from about 0.03 to about 10 Pa·s may also be used. The low pressure and room temperature imprinting characteristics are further advantages for use in conjunction with the methods of the present disclosure.

In certain aspects, the resist film uniformity on the flexible web and the resist thickness are important to both pattern quality and economic considerations related to manufacturing. If a first material layer film is too thin, it may cause insufficient filling of the first material into certain mold regions or it could potentially create a low mechanical strength that results in film fracture during mold releasing. If the first material layer is too thick, undesirable accumulation of first material from successive rolling cycles could potentially hamper further imprinting, but also could potentially squeeze out excess material resulting in undesirable waste.

Figure 3A:
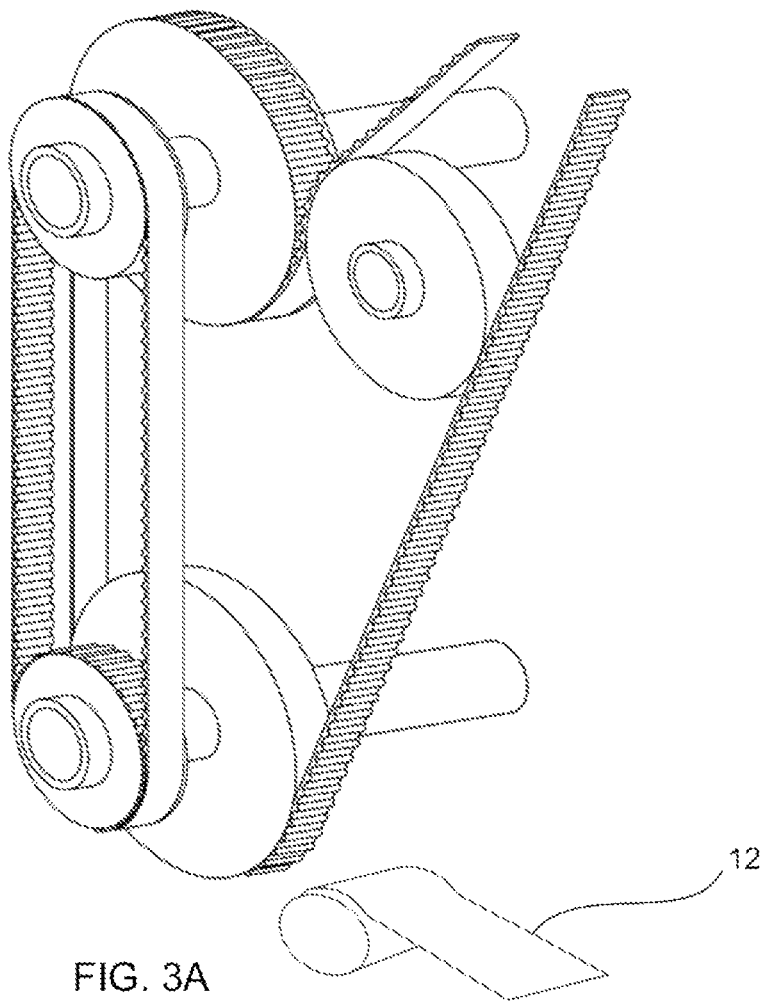
Figure 3B:
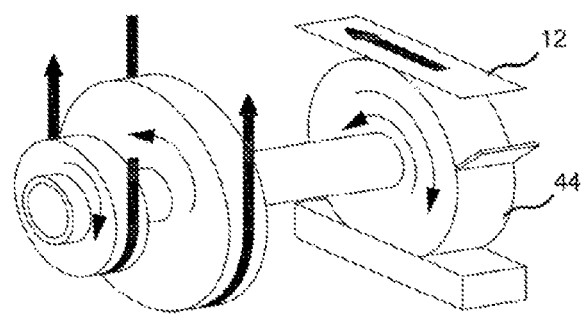

In certain aspects, the R2RNIL apparatus includes at least two parts, a coating module 14 and an imprinting module 16 (detailed versions shown in FIGS. 1a and 3a). In the coating process, the first material (imprint resist) is coated on the bare flexible substrate by a reverse or forward coating system (FIGS. 1b and 3b). Either forward or reverse coating (FIGS. 1b and 3b) may be selected, and adjustment made to the speed ratio of the moving web and the coating roller to obtain the desired resulting film thickness. Reverse coating, in which the web direction is opposite to the rolling direction, provides a uniform coating profile by eliminating film separation. However, the coating tends to be thick and difficult to control due to stagnation of resist at the confluence point. On the other hand, forward coating provides a thinner film layer but slightly lower surface uniformity than that of reverse coating.

Another feature of the R2RNIL coating module is the synchronized speed control of the coating roller and the web speed. Speed and synchronizing the speed control may be used to guarantee uniform coating thickness regardless of web speed. An AC motor may be used to drive the pulleys or rollers and synchronize the speed of the rollers, web, and substrate (FIGS. 1 and 3).

In the example shown in FIGS. 1 and 3, first material liquid resist is transferred from a container or reservoir 52 to a flexible PET substrate 12 by the coating roller 44. The thickness of the first material layer may be controlled using a doctor blade 54. The liquid resist coated on the substrate 12 is pressed with a flexible mold 22 that is wrapped around a roller 20 by both web tension and the pressure exerted by the backup rollers (FIG. 1c). Low-viscosity liquid resist rapidly fills into the mold cavity. After that, the resist is optionally cured in a curing module 30 by thermal and/or UV irradiation. Faithful patterning is possible when uniform pressure is applied during curing. Finally, the mold is released and the replicated nanostructures, comprising the inverse pattern of the mold, remain on the flexible substrate.

Pattern quality is determined in part by the pressure and curing conditions in the imprinting unit 70. The imprint unit 70 includes a contact module 16 having an imprint roller 20, one or more backup rollers 72, and a curing module section 30 (FIG. 1c). An ETFE mold 116 is attached on the stainless steel imprint roller 20 (FIG. 2). Since the substrate is subjected to a normal force from the tensioned web, slip motion caused by the tension of the substrate can be minimized. Web tension may be adjusted by changing roll friction as well. Two backup rollers 72 may be used to guarantee non-slip rotation (FIG. 1c). Low-viscosity curable monomer resist (the first material) quickly fills into the mold cavities by web tension and the pressure from the backup rollers 72. Without the backup roller 72 and tensioned web, slip may occur between the substrate 12 and the mold surface 22 due to non-uniform tension. Thereafter, the monomer resist is cured by heat and/or UV irradiation. For thermal curing, low-viscosity fast curable PDMS may be used and for UV curing, UV curable epoxysilicone may be used. For example, the resist precursor may be cured using convection heating (e.g., using a Steinel heat gun) or UV irradiation (e.g., Omnicure 1000 high-power UV source, EXFO). A UV shield may be used to confine the UV exposure only in the curing region, to prevent premature curing of resist before filling into the mold and reaching the imprinting zone. For example, a box-shaped UV radiation shield 76 may be used (FIG. 3c). Finally, the poly(ethylene terephthalate) (PET) substrate with roller-imprinted nanostructures continuously separates from the roller mold via the release roller (FIG. 3c).

The driving motor and speed controller may include the following. An AC motor with 180:1 gear head may be used to operate a R2RNIL system in accordance with the present teachings (not shown). Motor speed is optionally controlled by a speed controller (and a rotating direction is switchable. A main driving pulley winds the tensioned web and also rotates the coating roller that is connected to the coating pulley. Revolution speed of the imprint roller (diameter=60 mm) can be adjusted to produce a web speed from about 1.3 mm/s to 23.5 mm/s. This driving system provides a smooth motion with fine speed tuning to provide high quality patterning.

In certain aspects, a continuous roll-to-roll processing system employing a flexible substrate processed via a multi-roller transfer coating system module 524. The multi-roller transfer coating system module 524 includes a vat 522, a primary coating transfer roller 523, a secondary coating transfer roller 521, and a contacting coating transfer roller 525, which applies the first material to the substrate 520. A doctor blade 526 is optionally disposed in the system prior to the contacting/imprinting module 528, which can smooth or remove first material on the substrate 520. The coating module 528 includes two primary contact rollers 532 and two backup rollers 534. A patterned surface on a web 530 is rotated by the primary contact rollers and engages with the substrate 520 having the first material applied. In embodiments where the first material comprises one or more curable polymer precursors, the substrate is exposed to an energy source, such as a UV radiation source 536. The first material then cures on the substrate 520 and then is released from the web 530 having the patterned microstructures formed thereon.

In yet another embodiment shown in FIG. 22(b), a roll-to-plate mode of continuous processing apparatus 548 is shown, where a rigid substrate 552 is transferred on a conveyor web 550. A contacting/imprinting module 554 includes two contact rollers 556 and two backup rollers 562. A patterned surface on a web 558 is rotated by the primary contact rollers 556 and engages with the rigid substrate 552 to form a patterned surface. In embodiments where the first material comprises one or more curable polymer precursors, the substrate is exposed to an energy source, such as a UV radiation source 560. Of note, the UV radiation source is situated in a location where it applies radiation to an opposing side of the conveyor web 550 during processing in the contacting module 554 between the respective contact rollers 556. Such roll-to-plate nanoimprinting may also be used to produce the high density nanograting structures on a hard substrate, such as a glass plate, instead of the flexible substrate.

Figure 4A:
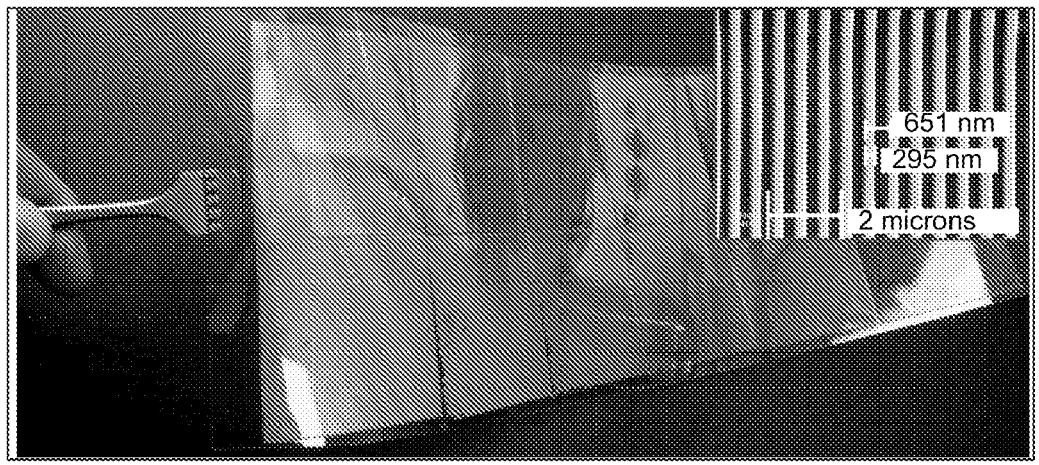
Figure 4B:
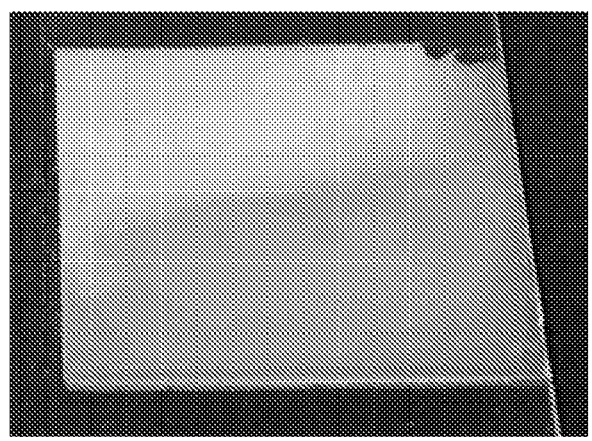

In some embodiments, for easy visualization of the imprinting results, a grating pattern of 700 nm period may be used, since a well-replicated grating structure with such a grating pattern shows strong light diffraction and therefore the pattern quality is easily examined by the eye. With reference to FIGS. 4a-4b, photographs of R2R imprinted grating patterns are shown on PET web in FIG. 4a. Roll-to-plate nanoimprinting results are shown in FIG. 4b, where strong and uniform light diffraction is observed from high density nano-grating structures on a hard glass plate.

Figure 5:
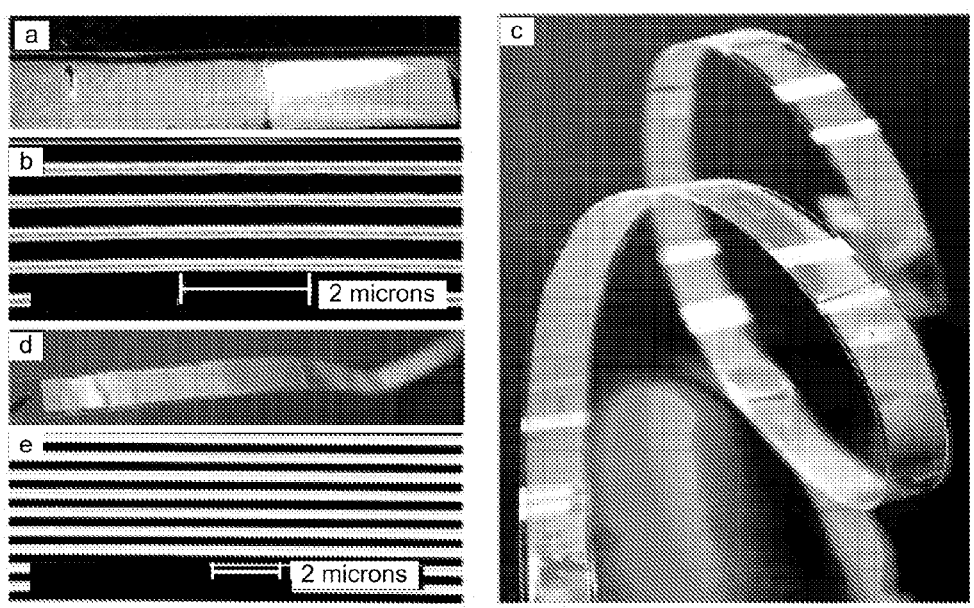

A 200 mm long, 300 nm line-width, and 700 nm period grating, imprinted using thermally cured PDMS on a PET substrate, is shown in FIGS. 5a and 5b. Curing of PDMS liquid resist is performed by convection heating using a heat gun.

A low viscosity, room temperature UV curable epoxysilicone may be used as the resist material. A high intensity (e.g., max. 18 W/cm$^2$) UV light (wavelength: 320-500 nm) source can be used to cure the resist. The light intensity for curing can be controlled by the distance from light guide and the aperture opening ratio; e.g., at a separation distance of about 5 mm, the epoxysilicone resist can be cured in about 0.2 sec. For example, based on the cure speed, web speeds of greater than 50 mm/s are possible in R2RNIL. As shown in FIGS. 5c-e, R2RNIL is used to produce a 570 mm long (width 10 mm), 700 nm period grating structure on PET substrate. Scanning electron microscopy (SEM) shows that the UV-cured epoxysilicone resist pattern has a higher quality than the thermally cured PDMS, which may be attributed to the lower viscosity of the epoxysilicone material that facilitates the fast filling of the mold cavity (Compare 5b and 5e). The printing speed may be adjusted depending on the period of the grating pattern and its aspect ratio. Fast UV curing of the resist material in the example allows a web speed of about 1 m min$^{-1}$.

Figure 6:
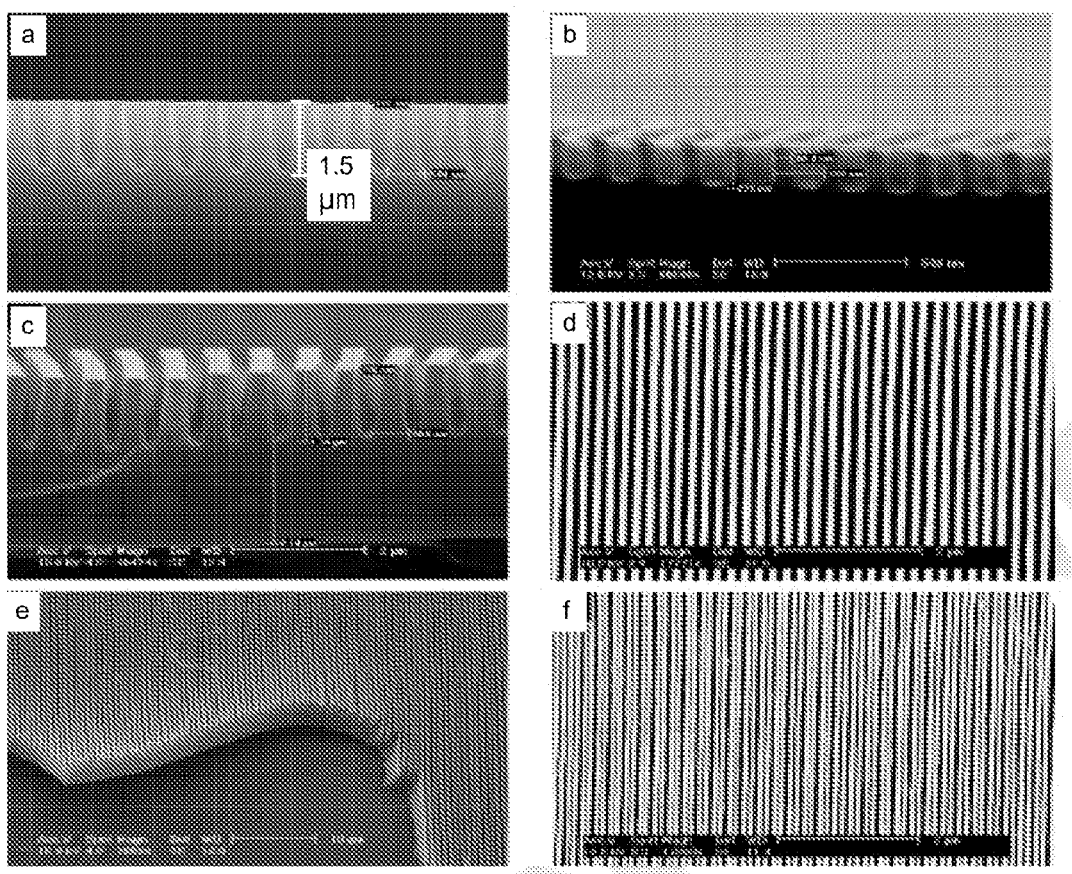

High aspect-ratio (AR=5.4:1) grating structures with sharp pattern definition fabricated by R2RNIL are shown in FIGS. 6b and 6c. The faithfully replicated epoxysilicone pattern should have the same geometry as in the original Si mold (FIG. 6a) because the ETFE mold, replicated from the Si mold, has the inverse pattern of the Si mold. Comparing the grating structure on the original Si mold (FIG. 6a) and the imprinted epoxysilicone pattern (FIG. 6c), excellent pattern replication is observed, even for the very fine details at the bottom of the grating trenches. The residual layer thickness is about 2 μm, but can be controlled through the web tension and backup roller pressure. Even though the ETFE mold has good anti-sticking properties, such a high aspect-ratio imprinted structure tends to show significant sticking to the ETFE mold, owing to the much larger contact area with the grating sidewalls on the mold. To achieve successful pattern transfer, oxygen plasma treatment may be used followed by thermal deposition of Silquest A187® adhesion promoter (GE Advance Materials) on the PET substrate before imprinting, which improves the adhesion of the resist pattern to the PET substrate. In addition, a few drops of fluorosurfactant may be added to the epoxysilicone resist to further reduce the adhesion between the imprinted pattern and the ETFE mold surface.

Continuous roll-to-roll imprinting of thinner and denser grating structures can potentially be more challenging because such patterns are mechanically fragile and tend to collapse during demolding if the trench is very small. Thus, the cured resist should have sufficient modulus and yield strength. Good adhesion of the resist to the substrate is also very important for such denser structures, which may be achieved by using the aforementioned adhesion promoter. FIGS. 6d and 6e show 200 nm period, 70 nm line-width epoxysilicone patterns produced by the UV R2RNIL process. An SEM image of a 100 nm period grating structure is also replicated successfully and shown in FIG. 6f.

The present apparatus and methods may be used to fabricate a metal wire-grid polarizer by using the R2RNIL process. Fabrication of metal wire-grids, where a single layer grating comprising metal wires on an optically transparent substrate is aimed, mostly involves lift-off or reactive ion etching processes. In order to achieve a high performance polarizer for the visible and UV ranges, high-aspect ratio metal grids are needed. Substantial progress has been made in developing metal gratings to operate down to the UV/Visible range. For example, bilayer metal wire-grids can be fabricated with good performance.

The bilayer metal wire-grid may be considered as two metal gratings separated by a certain distance. Not only does this type of polarizer provide a very high extinction ratio between light of two orthogonal polarizations, but it offers the advantage of easy fabrication and high defect tolerance. Such structures may be fabricated by evaporating a metal film onto a patterned photoresist grating. Since the fabrication process involves only photoresist patterning and metal evaporation, fabrication of bilayer metal gratings in this way is simpler and more cost effective than a single layer grating. As the final step includes evaporation of the metal film, the fabrication process is self-masking, which means that any defects on the nanostructured areas and unstructured areas that exist on the substrate are automatically covered by an opaque metal film. Thus, the fabrication is robust against pinhole generation, whereas in fabrication methods that incorporate metal etching or lift-off steps, defects can lead to pinholes. Such defects constitute one of the major limitations on the polarizing performance, in particular when high extinction ratios are aimed.

FIG. 7 is a schematic of a fabrication process for a metal wire-grid polarizer.

Figure 9:
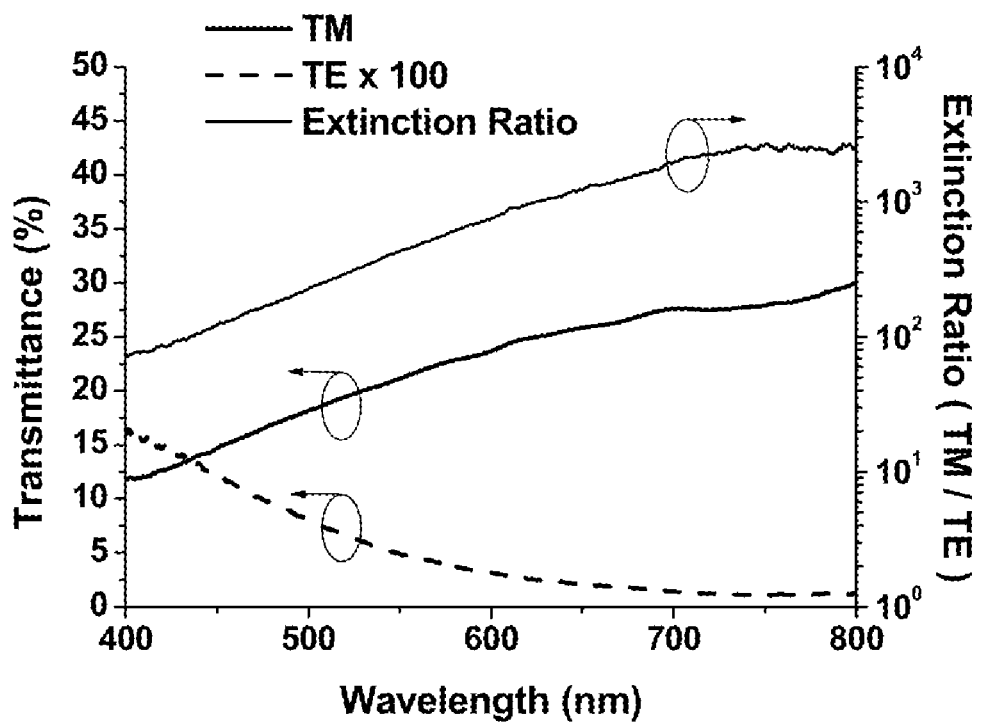
FIG. 9 is a spectral transmittance (transverse magnetic (TM) polarized light and the transverse electric (TE) modes) and extinction ratio (TM/TE) of a metal wire-grid polarizer fabricated according to certain R2RNIL processes of the present disclosure.

An example comprising a 198 nm period, 116 nm line width grating pattern, as illustrated in FIG. 8b, is prepared by the R2RNIL process and a 50 nm thick aluminum layer is thermally deposited on top of it, as illustrated by way of example, in FIGS. 7 and 8a. To verify the polarization effect quantitatively, spectral transmittance is measured using a UV/Vis spectrometer. Referring to FIG. 9, transmittance of the TM, TE modes and the extinction ratio of the two modes are graphically illustrated for a 100 nm period grating with 50 nm Al layer, with transmittance of about 30% at 800 nm wavelength and extinction ratio (transmittance of TM/transmittance of TE) over 2,000 at about 700 to about 800 nm wavelength. Several parameters may be optimized in order to improve the performance, including optimization of the grating period, line width, metal thickness, and residual resist thickness.

Fabrication of the ETFE mold may include the following features. A 200 µm thick ETFE film (Saint-Gobain SA, France) is sandwiched between an original Si mold containing grating structures and a Si substrate, and is pressed by a pressure machine with a temperature controller. A temperature of 220° C. and an imprint pressure of 2 MPa are used. After 5 min of hot-embossing, the sample is cooled to ambient temperature while keeping the pressure at 2 MPa. Then, the ETFE film is released from the Si mold by manual peeling.

Surface treatment of PET substrate may include the following features. To improve the adhesion of the PET substrate with the resist pattern, especially for the high aspect-ratio (>5) or small-pitch (200 nm/100 nm period) grating structures, the PET substrate is pretreated by oxygen plasma (100 W, 250 mTorr (1 Torr=1.333×10$^2$ Pa), 10 min) followed by thermal deposition of adhesion promoter, Silquest 187 (GE Advance Materials) at 100° C. for 15 min.

In summary, the present apparatus and methods including R2RNIL process can be used to form polymer patterns down to sub-100 nm feature size that are continuously imprinted on a flexible web. The process allows for a drastic increase in throughput, which addresses one of the important bottlenecks in nanopatterning for many practical applications.

Example 1

Example 1 illustrates apparatus and methods for fabricating a bilayer metal wire-grid polarizer using roll-to-roll nanoimprint lithography on a flexible plastic substrate in accordance with the present disclosure.

A bilayer metal wire-grid polarizer has several advantages over a single-layer wire-grid polarizer and a conventional polarizer, including higher polarization efficiency and easier fabrication. Fabrication of the bilayer metal wire-grid polarizer on a flexible plastic substrate can be achieved using a continuous roll-to-roll nanoimprint lithography (R2RNIL) process. To fabricate the wire-grid polarizer, a subwavelength grating structure in epoxysilicone material is first created on a flexible PET substrate by UV R2RNIL followed by aluminum deposition. Polarizers having an extinction ratio exceeding 1000 can be fabricated.

The polarizer is an important optical element used in a variety of applications. Wire-grid polarizers in the form of subwavelength metallic gratings are an attractive alternative to conventional polarizers because they provide a high extinction ratio between the transmitted transverse magnetic (TM) polarized light and the reflected transverse electric (TE) polarized light over a wide wavelength range and incident angle with long-term stability. In addition, subwavelength metallic gratings are thin and planar structures and may be easily integrated with other thin-film optical elements. For example, bilayer metal wire grids can be considered as two metal gratings separated by a certain distance. Not only does this type of polarizer show a very high extinction ratio between the lights of two orthogonal polarizations, but it also offers the advantage of easy fabrication and defect tolerance. A high-efficiency flexible metal wire-grid polarizer is thus fabricated using nanoimprint lithography and a shadow metal evaporation technique. For many practical applications of metal wire-grid polarizers, it is essential to have a high-speed fabrication process.

For example, the fabrication of wire-grid polarizers that do not require a reactive ion etching step can be scaled up to a roll-to-roll process. As such, the apparatus and methods of the R2RNIL process of the present disclosure can be used to produce flexible wire-grid polarizers.

Example 2

Example 2 illustrates apparatus and methods for fabricating an organic solar cell using a nanoimprinted transparent copper electrode in accordance with the present disclosure.

Cost effective and highly efficient renewable energy is becoming ever more important nowadays to combat the rising price of energy and global climate change. Solar energy is a non-exhaustible and green energy. Organic solar cells (OSC) have the merits of low cost, easy fabrication, and compatibility with flexible substrates over a large area and therefore are considered a promising energy conversion platform for clean and carbon-neutral energy production. The power conversion efficiency of OSC based on conjugated polymers has been steadily increasing through improved energy harvesting, efficient charge separation by the use of donor-acceptor heterojunction structure, and optimization of the processing parameters such as solvent evaporation time and annealing conditions.

Most organic solar cells have been built on indium tin oxide (ITO) substrates because ITO offers transparency in the visible range of the electromagnetic spectrum as well as good electrical conductivity. However, ITO is not an optimum electrode for solar cell application because the band structure of ITO can hinder efficient photocurrent generation. Moreover, poor mechanical stability of ITO can cause device failure when an ITO-coated flexible substrate is bent. In addition, the limited supply of the indium element and the increasing demand from the rapidly expanding display market has increased the cost of ITO drastically, which potentially prevents the realization of low cost and large scale OSC fabrication. Therefore, there is a need to replace ITO with other alternative electrode structures. For example, organic solar cells having carbon nanotube networks and Ag wire grids can be used as alternative transparent electrodes to replace ITO.

In the present example, apparatus and methods are provided for fabricating transparent metal electrodes for organic solar cell applications. The transparent metal electrodes are fabricated using the nanoimprint lithography (NIL) roll-to-roll continuous processing described above and have several advantages over other transparent electrodes, including those using ITO. First, the work function of a nanopatterned transparent electrode can be tuned by choosing different metal materials, which allows systematic studies of the effect of the electrode work function on the device performance. Second, a high electrical conductivity can be achieved without seriously compromising the transparency. Third, light absorption and the resulting power conversion efficiency of OSC may be increased by means of the light trapping phenomenon in the grating structure. And fourth, a large area organic solar cell having a transparent metal electrode could be realized at a low cost by using the present roll-to-roll nanoimprint techniques. The present example demonstrates that the power conversion efficiency of an OSC having a nanopatterned metal electrode (e.g., inexpensive Cu material) is comparable to that of the analogous cell using a high performance ITO electrode. The present example also illustrates the effect of the anode work function on the OSC's fill factor (FF) and the photocurrent. Design principles to make suitable transparent metal electrodes and fabrication methods that may be adapted to roll-to-roll processing are illustrated.

The nanoimprint mold used for making the transparent metal electrode includes two sets of grating structures which are oriented orthogonally to each other. The major grating having a 700 nm period determines the overall optical transparency. Specifically, the transmittance of the metal electrode is determined by the line-width of the grating lines, or equivalently, the opening ratio of the grating. The orthogonal secondary grating lines having a 10 μm period and a 400 nm line-width are used to ensure electrical connectivity of the major 700 nm period grating in case of a fabrication defect.

Figure 10:
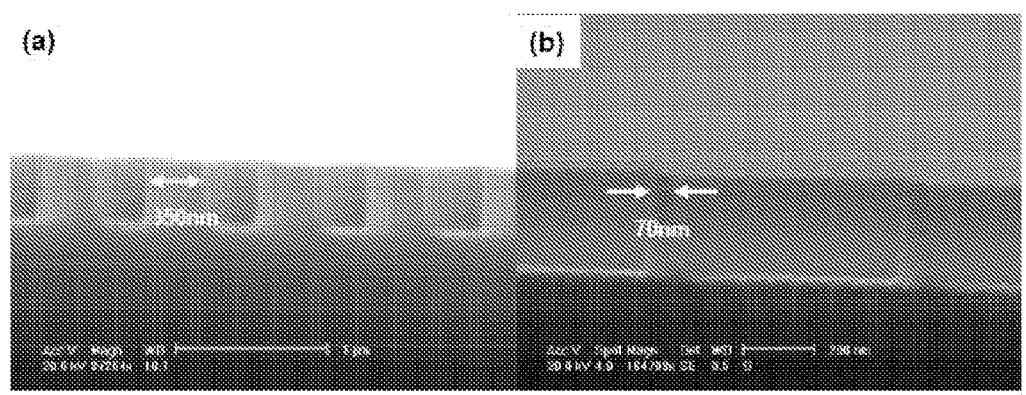
FIG. 10(a) shows an SEM image of an original silicon dioxide ($SiO_2$) grating with a period of 700 nm and a duty cycle of 50% and FIG. 10(b) shows an SEM image after buffered hydrofluoric acid (BHF) etching for 80 seconds.

To obtain high optical transparency, the line-width of an original 700 nm period grating with a 50% duty cycle is reduced by a simple wet chemical etching process rather than using a shadow evaporation method. The wet etching approach produces gratings with smoother sidewalls, which could help to reduce the surface scattering of electrons and therefore increase the conductivity of the wire electrode. FIG. 10a shows an SEM image of an original $SiO_2$ grating with a 700 nm period and a 50% duty cycle, and FIG. 10b shows an SEM image after a buffered hydrofluoric acid (BHF) etching for 80 s. A line-width of 70 nm is achieved using this technique.

Figure 11:
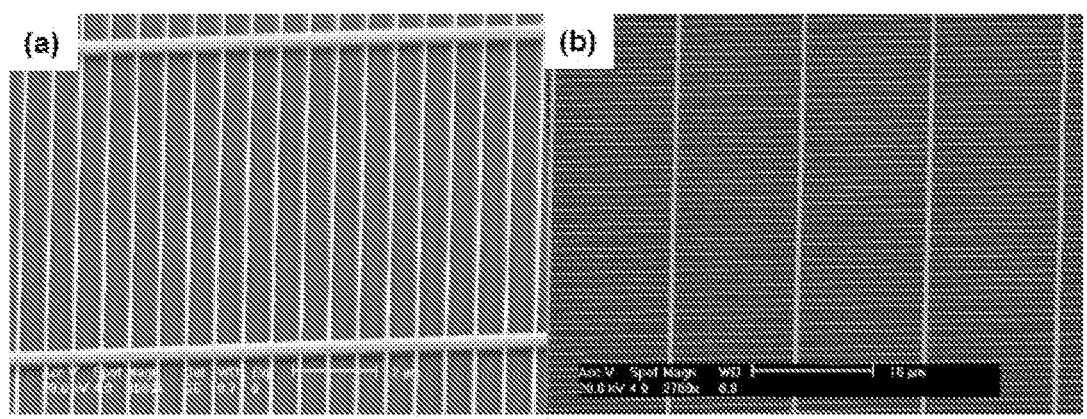

As illustrated by FIG. 11, the rectangular grid pattern on the imprinting mold (FIG. 11a) is then created by using the two grating molds and performing NIL imprinting twice, with respective orientations orthogonal to one another. NIL is used again to transfer the rectangular patterns of the mold into a resist layer on a glass substrate. Oxygen residual etching, metallization, and lift-off completed the fabrication of the transparent metal electrode on glass. FIG. 11b shows the SEM image of the fabricated metal electrode on a glass substrate. Samples may have a patterned transparent metal electrode area of 2×2 $cm^2$.

Various metals may be used in the electrode. For example, Au, Cu, and Ag electrodes with a thickness of 40 nm are prepared using the present methods to illustrate that the fabrication process can be readily applied to various metals and to illustrate the effect of the anode's work function on the cell performance, such as the photocurrent, the fill factor (FF), and the open circuit voltage ($V_{oc}$). The work functions for Au, Cu, and Ag are 5.22 eV, 4.65 eV, and 4.0 eV, respectively. The optical transmittance of transparent Au, Cu, and Ag electrodes in the visible wavelength range are measured and shown in FIG. 12. As a comparison, the optical transmittance of a commercial high quality ITO is used for a control device and is also measured and included in FIG. 12. All the transmittance measurements are referenced to air.

ITO has a peak transmittance of 90% at 500 nm and an average transmittance of 87% in the whole visible range. The transmittance of the nanopatterned metal electrodes is relatively flat over the visible region. The wavelength dependency observed previously in the nanoimprinted metal electrode having a wider line-width (e.g., 200 nm and 120 nm) is significantly reduced by using a narrower metal line-width of 70 nm. The average transmittance in the visible range is 84%, 83%, and 78% for Au, Cu, and Ag electrodes, respectively. Interestingly, the Ag electrode has lower transmittance than the Au and Cu electrodes, even though it has same line-width and thickness, which is related to dispersion property of the Ag material.

The sheet resistance (ohm/square, Ω/cm), another parameter of a transparent and conductive electrode, is measured by the four point probe method. High performance ITO has a sheet resistance of 12 Ω/cm while Au, Cu, and Ag electrodes have higher sheet resistances of 24 Ω/cm, 28 Ω/cm, 23 Ω/cm, respectively. The increased sheet resistance due to the reduction in line-width may be compensated by depositing thicker metals. For example, an 80 nm thick Au electrode can reduce the sheet resistance by a factor of three (about 8 Ω/cm) at the cost of a small decrease (about 7%) in the optical transmittance. Therefore, a transparent metal electrode is a promising alternative to ITO because the transmittance and sheet resistance may be easily tuned by varying the metal line-width and the thickness to obtain the required transmittance and conductivity.

To evaluate use of the nanopatterned metal electrode as a transparent conducting electrode for optoelectronic devices, bulk heterojunction organic solar cells are fabricated and compared with devices made with a high performance ITO electrode. Transparent Au, Cu, and Ag electrodes that are 40 nm thick are used as anodes to make the organic solar cells. The fabricated multi-layer solar cells consist of ITO or nanopatterned metal anode, conducting poly(3,4-ethylenedioxythiophene) poly(styrenesulfonate) (PEDOT:PSS), conjugated poly(3-hexylthiophene) (P3HT) and the fullerene derivative [6,6]-phenyl-$C_{61}$ butyric acid methyl ester (PCBM) (P3HT/PCBM) blend (1:1 by wt ratio), and LiF and Al cathode. Because the nanopatterned metal electrode has a uniform thickness, it is possible to spin coat a very thin PEDOT:PSS layer (about 50 nm) on top it without causing current shunt path which will lower the fill factor and reduce the power efficiency. In the case of random nano-wire structures, such as a Ag nano-wire mesh, a thin coating of PEDOT layer could increase the current shunt path due to the roughness or unevenness of the random Ag wires.

Examples of fabricated solar cells have an area of approximately 0.1 $cm^2$. The patterned Al cathode has an isolated island-type geometry to exclude the overestimation of the photocurrent when a cross-bar type geometry is used. Current versus voltage characteristics are measured in air by illuminating the OSC devices with AM 1.5 G simulated sun light (Oriel Solar Simulation, 100 mW/cm²). As shown in FIG. 13, the current versus voltage characteristics of the solar cells having the nanopatterned transparent metal electrodes and ITO electrode are very similar to each other, indicating that such electrodes are interchangeable. All devices show a power conversion efficiency of about 2%. Detailed device characteristics are summarized in Table 1.

TABLE 1

Current density versus voltage characteristics of the solar cells having the nanopatterned transparent Au, Cu, Ag, and ITO electrode (Intensity: AM1.5 G 100 mW/cm²).

| Transparent Electrode | Jsc (mA/cm²) | Voc (V) | FF | Efficiency (%) |
|---|---|---|---|---|
| ITO | 5.59 | 0.59 | 0.61 | 2.00 |
| Au | 5.50 | 0.57 | 0.62 | 1.96 |
| Cu | 5.71 | 0.57 | 0.63 | 2.06 |
| Ag | 5.34 | 0.58 | 0.65 | 2.00 |

Although the nanopatterned metal electrodes are 8-18% less transparent than that of ITO in the absorption band of P3HT:PCBM around 500 nm, very similar photocurrents are generated under the same intensity light illumination. The light trapping effect in the grating structure in the transparent metal electrodes may compensate for the effect of lower transmittance, resulting in similar absorption by the P3HT/PCBM blend layer. Interestingly, the device using a Cu electrode shows a slightly increased photocurrent and power conversion efficiency of 2.06% compared to that of the Au and ITO electrodes.

As shown in FIG. 12, the transmittance of the Cu electrode is similar to that of the Au electrode, which in principle should produce same photocurrent. The one difference between the Au and the Cu electrode device is the interface to the PEDOT:PSS. Although not wishing to be bound by theory, it is possible that the interface between Cu and PEDOT:PSS is more efficient for hole collection than that of Au and PEDOT:PSS due to the following reason. To collect the photo-generated holes, an anode with lower work function than that of PEDOT:PSS is preferred. The fact that Au has a work function of about 5.22 eV, which is similar to but slightly higher than that of PEDOT:PSS likely impedes the hole transfer from PEDOT:PSS to the Au electrode. On the other hand, Cu has a lower work function (about 4.65 eV) than that of Au, which may facilitate the hole collection. However a lower work function anode may also reduce the work function difference between the anode and the cathode, and could result in a smaller internal field responsible for transporting the charges to the electrodes.

For example, increasing the work function of cathode metals (similar to decreasing the work function of the anode) may cause lower photocurrent due to the smaller internal electric field as a result of the lower work function difference between the two metal electrodes. Fortunately, the reduced internal field effect is minimized in the present devices because the nanopatterned metal electrode occupies only 13% of whole area on the anode side. The remaining area can be occupied by PEDOT:PSS. Therefore, the internal electric field in most portions of the solar cell is determined by the work function difference between PEDOT:PSS and the Al cathode rather than by the metal-wire electrode. From this view of point, efficient hole collection can be achieved by using a metal wire electrode having lower work function than that of PEDOT:PSS, as in the case Cu electrode. This may also explain why in the case of the Ag electrode, though it has the lowest transparency (around 500 nm range) which will lead to low light absorption by P3HT/PCBM and therefore the lowest photocurrent, the power conversion efficiency (about 2%) is comparable to that of the other devices due to it having the highest fill factor (FF). This could be attributed to the fact that Ag has the smallest work function of all three metals (about 4.0 eV), which makes hole collection very efficient and consequently results in a high FF.

The hole collection efficiency may be increased by using metals with low work function, but since the metal nanograting only covers a small fraction of the anode region, photogenerated holes have to transport through the continuous PEDOT:PSS layer to the metal-wire electrode in order to be measured. Therefore, it is important to evaluate whether the conductive PEDOT:PSS can deliver the holes efficiently to the metal electrode. To quantify this, the voltage drop in the PEDOT layer is estimated along the distance through which the holes have to travel. The maximum distance that holes need to travel is less than 350 nm; i.e., half of the grating period. The voltage drop in the PEDOT:PSS layer may be calculated by integrating the photocurrent generated within a strip of dL and at a distance L away from each metal line:

$$\Delta V = \int J_{ph} \cdot R_{sq} \cdot L dL \qquad (1)$$

where $J_{ph}$ is the photocurrent density, $R_{sq}$ is the sheet resistance of PEDOT:PSS, and L is the distance from the metal line with a period of 700 nm. By using the sheet resistance of 150,000 Ω/cm for a 100-nm thick PEDOT:PSS and a maximum travel distance L of 350 nm, it is estimated that the voltage drop is only on the order of µV for each period even if we consider a high efficiency device delivering a photocurrent of 10 mA/cm². Moreover, the voltage drop in the overall device active area (i.e., about 0.1 cm² in the present example) is only several mV.

From the above consideration, it is possible to effectively treat the transparent metal-wire electrodes as a uniform film for the purpose of photocurrent collection. Based on this analysis, a simple design rule that correlates the optimum period of the nanopatterned metal electrodes with the sheet resistance of the PEDOT:PSS can be derived as shown in FIG. 14. If the device area is taken to be 0.1 cm² and a voltage drop of 10 mV is allowed in the overall PEDOT:PSS area, the appropriate grating period of the nanopatterned metal electrode at a certain sheet resistance of PEDOT:PSS can be found in the shaded area. The darker the region in the shaded area, the better the OSC performance will be. Here the only assumption made is that the optical transmittance of the metal electrode needs to be comparable to that of the ITO electrode. This means that the line-width of the grating is about 10% of the period. Outside the shaded area the transparent metal electrode is still able to collect generated photocurrent, but with reduced efficiency due to the increased voltage drop in the PEDOT:PSS layer.

As demonstrated, the present nanopatterned transparent metal electrodes are alternatives to the conventional ITO electrode. They can replace the ITO electrode without sacrificing power conversion efficiency for the solar cell application. Moreover, when the structure is fabricated by the present teachings, a roll-to-roll process, cost effective and large area fabrication of the nanopatterned electrode are realized.

The present example illustrates fabrication of transparent metal electrodes onto a PEDOT:PSS-coated glass substrate by using a flexible PMDS mold and a metal transfer process, as showing in FIG. 15a. Flexible molds are desirable in the roll-to-roll nanoimprint process. A soft PDMS stamp 300 is first fabricated from a nanoimprinted resist template followed by a 40 nm-thick Cu deposition (metal layer 302. After spincasting of a PEDOT:PSS layer 304 on a glass substrate 306, the PDMS stamp 300 is laminated on top of the PEDOT:PSS layer 304.

After applying heat (e.g., a brief baking) via a heat source 308 concurrently with slight pressure application, the PDMS stamp 300 is peeled from the PEDOT:PSS layer 304, and the patterned Cu electrodes 302 are left on the PEDOT:PSS layer 304 over the substrate 306. FIG. 15b shows an SEM image of the PDMS stamp having 40 nm-thick Cu on top, and FIG. 15c shows an SEM image of the transferred Cu electrode onto the PEDOT:PSS layer. In this manner, the results show that the fabrication of the nanopatterned metal electrode is extended to continuous roll-to-roll processing.

In summary, we demonstrated that various metal-wire electrodes fabricated by nanoimprint lithography can replace the conventional ITO electrode in solar cell fabrication. The nanopatterned metal electrodes have high optical transmittance in the visible range as well as high electrical conductivity. Organic solar cells made with the nanopatterned metal electrodes having optimum geometry have comparable performance to the device made with high performance ITO electrode. The effect of the work function of the nanopatterned electrode on the device performance was also analyzed. A metal electrode with a lower work function than the PEDOT:PSS can facilitate the charge transfer from the PEDOT:PSS to the metal electrode, leading to increased FF and higher power efficiency. The present disclosure provides methods of fabricating nanopatterned electrodes by using a flexible stamp and a metal transfer process in a roll-to-roll process. The use of very inexpensive Cu material as a transparent electrode and the roll-to-roll fabrication helps realize low cost manufacturing of large area organic solar cells.

Organic solar cell fabrication includes the following features. Transparent metal (Au, Cu and Ag) electrodes and ITO on glass are cleaned in acetone and isopropyl alcohol (IPA) under sonication for 30 min each. Cleaned substrates are then transferred to a $N_2$ purged glove box, and filtered PEDOT:PSS is spin-coated onto the metal electrode at 3000 rpm for 30 s, producing a 95 nm thick layer, which is then baked at 120° C. for 15 min. To increase the wetting to the substrate and to control the PEDOT:PSS thickness, 0.2% Silquest surfactant and 30% IPA are added to PEDOT. The light absorbing material, a blend of P3HT and PCBM (1:1 ratio by weight) in chlorobenzene, is spin-coated after filtration onto the PEDOT:PSS layer at 1000 rpm for 30 s, which gives a 105 nm thick layer, which is then annealed at 130° C. for 20 min. After cooling to room temperature, samples are brought to an evaporation chamber from the $N_2$ glove box. Thermal evaporation of a 1 nm thick LiF layer followed by a 70 nm thick Al layer through a shadow mask completes the organic solar cell fabrication.

Fabrication of the metal electrode onto the PEDOT layer includes the following features. Nanoimprinted resist template using the mold shown in FIG. 11a is used for the fabrication of PDMS stamp. High modulus PDMS is drop cast and cured at 70° C. for 5 min producing about 100 μm thick PDMS layer on resist. Commercially available PDMS (Sylgard 184) is then drop cast and cured at 70° C. for 2 hours to support the thin layer high modulus PDMS. After removing the PDMS stamp from the resist template, 40 nm thick Cu and 2 nm thick Ti layers are sequentially deposited on the PDMS stamp by electron-beam evaporation at a rate of 2 Å/s. The 40 nm thick Cu is then transferred onto a PEDOT:PSS layer spin coated on PET or $SiO_2$ substrate under a pressure of 10 psi and a temperature of 80° C. for 1 min. 0.2% Silquest and glycerol are added to PEDOT:PSS to increase the wetting of PEDOT:PSS to the substrate and prevent solvent from evaporating, respectively.

Example 3

Example 3 illustrates apparatus and methods for fabricating nanoimprinted semitransparent metal electrodes and their application in organic light-emitting diodes in accordance with the present disclosure.

Organic light-emitting diodes (OLEDs) are promising for full-color, full-motion, flat panel display applications because they offer several advantageous features, for example, ease of fabrication, low cost, light weight, bright self-emission, a wide viewing angle, and the possibility of flexible displays. The basic OLED structure includes a number of organic semiconductor layers sandwiched between a cathode and an anode. For efficient electron injection into the organic layers, low-work-function materials are required for the cathode. A very thin lithiumfluoride (LiF) layer with a thick Aluminum (Al) capping is widely used for this purpose. For the anode, indium tin oxide (ITO) is the predominant choice because it offers transparency in the visible range of the electromagnetic spectrum as well as electrical conductivity.

However, several aspects of ITO are far from optimal for high-performance OLEDs. Similar to the reasons for difficulties encountered in OSC discussed above, the migration of indium and oxygen from ITO into organic semiconductors during OLED operation may cause device degradation. The electrical properties of ITO also greatly depend on the film preparation. The rough surface of the deposited ITO film and the work function of ITO, about 4.7 eV, limit the efficiency of the hole injection. The typical sheet resistance of a 100 nm thick ITO layer, about 20-80 ohms/square (Ω/cm), is still high, which causes a voltage drop along the addressing line, thus limiting the operation of a large-area passive matrix OLED array. Moreover, the cost of ITO has escalated in recent years because of the jump in price of the element indium.

Several alternative materials, for example, titanium nitride (TiN), Al-doped zinc oxide (ZnO), and fluorine tin oxide, have been investigated as anode materials instead of ITO; however, none are optimal for use as the anode in OLEDs because they have either a lower work function or a lower conductivity than ITO. Other transparent conducting oxides, such as Ga—In—Sn—O (GITO), Zn—In—Sn—O (ZITO), Ga—In—O (GIO), and Zn—In—O (ZIO), that have a higher work function and a similar electrical conductivity when compared to ITO have also been examined as OLED anode materials. However, they are potentially problematic because they also contain the element indium that i) may diffuse into the organic layer in the OLED; and ii) has a high price, making these electrodes expensive. Besides these materials several metals with a high work function, such as Au, Ni, and Pt, have been investigated as anodes for OLEDs. In these cases the metal is used to modify the surface of the ITO electrode, or as an anode for top-emitting devices. A surface-modified thin Ag film has been used as a semitransparent electrode instead of ITO, but its transparency is low. Recently, carbon nanotube films have been investigated as transparent, conductive electrodes, but they have a high sheet resistance that may limit the device performance.

In the present example, semitransparent metal electrodes are fabricated by nanoimprint lithography (NIL) in accordance with the principles in the present disclosure for use as OLED electrodes (e.g., anodes). NIL is well-suited to the area of organic electronics, which requires low-cost and high-throughput fabrication at high resolution. The fabricated semitransparent metal electrode offers several advantages over ITO for OLED applications. First, several problems associated with ITO can be eliminated, such as device degradation by indium diffusion and high costs. Second, efficient hole injection into the organic semiconductor can be realized by choosing metals with a high work function, such as Au or Pt. Third, a semitransparent metal electrode is suitable for top emitting devices and tandem structures. Last, but not least, the output efficiency of the OLED can be enhanced by preventing waveguiding in the ITO layer, which occurs as a result of its high refractive index and is one of the limitations to the external efficiency of OLEDs, and by forming a two-dimensional (2D) hole array with proper periodicity. Electrodes formed in accordance with certain aspects of the present disclosure provide the ability to control the optical transparency and the electrical conductivity by separately tuning or changing the aperture ratio and metal thickness, thereby making it possible to tailor the structures for different applications.

The semitransparent metal electrodes may be in the form of a nanometer-scale periodically perforated dense metal mesh on glass. Two design considerations are addressed in such structures: i) the line width of the metal mesh is designed to be subwavelength, to provide sufficient transparency and to minimize light scattering; and ii) the period of the mesh is chosen to be sub-micrometer to ensure the uniformity of the current injection into the organic semiconductors. Such large-area dense nanostructures can be fabricated by NIL, which is ideal for this application because of its high resolution and its high-throughput features. Metal mesh structures are fabricated by NIL by using a mold with periodic grid patterns, followed by a metal deposition process and a lift-off process. The rectangular grid pattern on the imprinting mold (FIG. 11a) is created by applying NIL twice, using two grating molds. One grating mold has a period of 700 nm, which defines the main part of the semitransparent metal electrode, while the second grating mold, imprinted orthogonally (i.e., rotated about 90°) to the 700 nm period grating, has a period of 10 μm and is used to ensure the electrical connectivity of the 700 nm period grating lines, in case some lines are disconnected because of defects in the fabrication processes. The horizontal metal lines produced by the second grating also help to distribute the current flow in the semitransparent electrodes in a quasi-2D fashion, which may be important for addressing the OLED devices in certain applications.

Optical transparency and electrical conductivity are two important design considerations for transparent electrodes. These factors may be quantified experimentally by measuring the transmittance and the sheet resistance, respectively. The parameters for tuning transmittance and sheet resistance in the present structures are the mesh line width, the metal thickness, and the periodicity of both grating lines. The metal thickness and the overall mesh fill factor relate to the sheet resistance of the structure. These two parameters can be controlled separately, providing sufficient design latitude for optimal performance. The present techniques, based on imprinting and shadow evaporation, allow grating structures with various line widths to be fabricated while keeping the same period. By using these techniques, large-area metal meshes of different line widths may be fabricated.

Transmittance may be tuned by changing the opening ratio in the metal mesh structure. To characterize the optical transmittance and the sheet resistance (Ω/cm) of the semitransparent electrodes, two sets of samples having large-area rectangular grids are fabricated. One has a line width of 200 nm, a metal thickness 40 nm, and a 2 nm Ti adhesion layer; while the other has a line width of 120 nm, metal thicknesses of 40, 60, and 80 nm, and a 2 nm Ti adhesion layer. Several other metals are contemplated, as noted above, such as Au, Cu, and Al, by way of example.

The increase in transmittance achieved by reducing the metal line width is accompanied by an increase in sheet resistance, but such an increase of sheet resistance can be compensated for by using metals at greater thicknesses. The average transmittance and sheet resistance for metal electrodes with a line width of 120 nm and several thicknesses are summarized in FIG. 16. The sheet resistance for the metal electrodes with a line width of 200 nm and a thickness 40 nm is 7.68, 8.45, and 10.8 Ω/cm for Au, Al, and Cu electrodes, respectively. For the Au electrode, the sheet resistance increases from 7.68 to 11.7 Ω/cm when the line width is reduced from 200 nm to 120 nm for higher transmittance. The increase in sheet resistance of the Al and Cu electrodes is similar to that of the Au electrode.

As shown in FIG. 16a, the sheet resistance may be significantly reduced by making the metal electrode thicker. For example, the sheet resistance of 11.7 Ω/cm for the 40 nm thick Au electrode decreases to 4.79 Ω/cm for the 80 nm thick Au electrode, with only a small reduction in transmittance. For all the considered cases the sheet resistance decreases by more than 59%, but the transmittance decreases by less than 8% on increasing the thickness of the metal from 40 nm to 80 nm. These results are graphically depicted in FIG. 16b. The fitted line illustrates that the sheet resistance may be further decreased to less than a few ohms per square with only a small decrease of average transmittance if metals thicker than 80 nm are used. These results confirm that the transmittance and sheet resistance of the semitransparent metal electrode can be easily tuned by varying the metal line width and thickness.

An important observation can be made from these results, namely that the transparency of such an electrode structure can be increased without sacrificing the overall conductivity by using narrower and thicker metal lines. This characteristic is another advantage of devices formed in accordance with the present teachings over an ITO electrode, in which the sheet resistance has to be compromised to achieve high transmittance. Therefore, nanoimprinted semitransparent metal electrodes afford several advantages, not only because they can avoid the disadvantages of the ITO electrode but also because they can meet the requirements of both sheet resistance and optical transmittance when the duty cycle of the periodic patterns on the mold and the metal thickness are optimized.

To demonstrate the potential use of semitransparent metal electrodes as a transparent conducting electrode for optoelectronic devices, an OLED is fabricated using such an electrode as the anode. Although Au is preferred because of its high work function for efficient hole injection, the present example uses Cu as the anode material because of its much lower cost. Cu, being one of the less expensive metals, is well suited for practical organic electronic applications as it has a similar work function to ITO (about 4.7 eV). Semitransparent Cu electrodes with a thickness of 40 nm and line widths of 200 and 120 nm are chosen as anodes in the OLEDs. The OLED device includes a semitransparent Cu mesh as the anode, poly(styrene sulfonate)-doped poly(3,4-ethylenedioxythiophene) (PEDOT) as the hole transport layer, poly(2-(2-ethylhexyloxy)-5-methoxy-1,4-phenylenevinylene) (MEH-PPV) as the emissive layer, and LiF/Al as the cathode. Additional device fabrication details are disclosed below.

FIG. 17 shows current density versus voltage and electroluminescence characteristics of the OLEDs using semitransparent Cu anodes. The junction exhibits good rectifying characteristics. The turn-on voltages of these OLEDs are similar to the control samples made with ITO electrodes. The OLED made with the 120 nm Cu anode shows a slightly higher turn-on voltage than the device made with the 200 nm Cu anode and, as a result, lower current density at a given bias after the device is turned on. As a comparison, the current density versus voltage characteristic of an OLED made with a 40 nm thick continuous Cu film as the anode is also shown in FIG. 17a. It shows a similar characteristic to the OLED made with the nanoimprinted Cu anode, only with a slightly higher current density at a given bias. These results illustrate that the overall mesh fill factor does not significantly affect the device's electrical performance. Both devices show strong electroluminescence peaked at 577 nm, which is the same as the photoluminescence (PL) peak of MEH-PPV, as shown in FIG. 17b. Although the total output power of these OLEDs is not measured, to the naked eye the device made with the semitransparent Cu electrode appears as bright as the control sample made using the ITO electrode. Upon optimization, such a semitransparent metal electrode can be used to replace the ITO anode.

In summary, the present apparatus and methods are used to fabricate a semitransparent metal electrode in the form of a nanometer-scale periodically perforated metal film that shows high optical transmittance in the visible range of the electromagnetic spectrum as well as excellent electrical conductivity. As an example application, an OLED is fabricated using a semitransparent Cu electrode as the anode to replace the conventional ITO electrode. A semitransparent metal electrode can be used instead of ITO in many other applications for which specific transmittance and conductivity are required, because they are easily tuned by varying the line width and the thickness of the metal. Moreover, the work function of an anode can be easily changed by choosing different metal materials, which provide more flexibility in adjusting the anode work function relative to device behavior. Furthermore, a similar structure can be fabricated on other substrates besides glass, such as for example a flexible plastic substrate. The present example demonstrates that semitransparent metal electrodes are an attractive and practical solution for organic devices such as OLEDs and organic solar cells.

OLED fabrication includes the following features. Semitransparent Cu anodes on glass are cleaned in acetone and isopropyl alcohol (IPA) under sonication for 20 minutes each and then exposed to oxygen plasma to thoroughly remove organic residue. The plasma treatment also makes the metal anode more hydrophilic, allowing for easy spin-coating of the PEDOT hole-transport layer. Filtered PEDOT is spin-coated onto the Cu anode at 1500 rpm for 30 seconds, producing an 80 nm thick layer, and then baked at 120° C. for 1 hour. Subsequently, the emissive organic layer MEH-PPV (0.5% by weight, dissolved in toluene) is spin-coated after filtration onto the PEDOT layer at 1000 rpm for 30 seconds, which gives a 50 nm thick layer, which is then baked in a vacuum oven for 24 hours at ambient temperature. Thermal evaporation of a 1 nm thick LiF layer followed by a 100 nm thick Al layer through a shadow mask completes the OLED device fabrication.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method for patterning at least one microscale feature, the method comprising:

applying a solvent-less first material comprising at least one curable polymer precursor to a major surface of a substrate, wherein said solvent-less first material is a liquid resist having a viscosity of less than or equal to about 10 Pa·s;

contacting a surface of a roller with said major surface having said first material applied thereon, wherein said roller surface defines a pattern that forms at least one microscale feature in said first material; and curing said at least one curable polymer precursor to form a cured polymeric material defining said at least one microscale feature.

2. The method of claim 1 wherein said surface of said roller has an average surface energy of less than about 25 dyne/cm.

3. The method of claim 1 further comprising applying a metal material over said cured polymeric material on said major surface having said at least one microscale feature formed thereon.

4. The method of claim 3 wherein said metal material is applied at an incident angle relative to said major surface.

5. The method of claim 3 wherein said metal material is applied by at least one process selected from chemical vapor deposition and/or physical vapor deposition.

6. A wire grid polarizer formed according to the method of claim 3 wherein said at least one microscale feature defines a multi-layer grating structure on said major surface of said substrate.

7. The wire grid polarizer of claim 6 wherein said grating structure is formed and has a period of less than about 1 µm suitable for polarizing electromagnetic energy waves in the visible to near-IR ranges.

8. A semi-transparent or transparent electrode for an electronic device formed according to the method of claim 3 wherein said at least one microscale feature defines a first grating structure having a first orientation and a second grating structure having a second orientation with respect to said major surface of said substrate, wherein said first orientation is disposed at an angle to said second orientation.

9. The method of claim 1 wherein said substrate is pretreated prior to said applying to enhance adhesion of said first material to said major surface.

10. The method of claim 1 wherein said at least one curable polymer precursor comprises epoxysilicone, epoxy precursor (SU-8), polydimethylsiloxane, PDMS, or thermal or photo-curable silsesquioxane.

11. The method of claim 1 wherein said curing is accomplished by applying thermal energy and/or actinic radiation energy.

12. The method of claim 1 wherein said applying of said first material is by ink jetting, spraying, and/or by gravure application methods.

13. The method of claim 1 comprises a continuous process of continuous applying, contacting, and curing steps, which are accomplished by passing said substrate through a coating module, a contacting module, and a curing module and said continuous process is capable of patterning said substrate at a speed of at least about 1 cm/s.

14. The method of claim 13, wherein said contacting module exerts pressure to the substrate by web tension, back-up rollers, or a combination thereof.

15. The method of claim 1, wherein said solvent-less first material comprises a liquid resist material selected from the group consisting of: thermal-curable liquid polydimethylsiloxane resist and an ultraviolet-curable low viscosity liquid epoxysilicone.

16. A method for patterning at least one microscale feature, the method comprising:

applying a solvent-less first material to a major surface of a substrate, wherein said solvent-less first material is a liquid resist having a viscosity of less than or equal to about 10 Pa·s;

contacting a low-surface energy roller surface with said major surface having said first material applied thereon under pressure, wherein said low-surface energy roller surface defines an imprinted pattern that forms the at least one microscale feature in said first material; and applying a metal material over said first material, thereby forming the at least one microscale feature.

17. The method of claim 16, wherein said first material comprises imprintable material and/or a curable polymer precursor.

18. A method for patterning at least one microscale feature, the method comprising:

continuously imprinting a solvent-less first material on a major surface of a substrate by applying pressure to said substrate and/or to a roller contacting said first material disposed between a surface of said roller and said major surface, wherein said roller surface defines a pattern that forms at least one microscale feature comprising the first material on said major surface and said solvent-less first material is a liquid resist having a viscosity of less than or equal to about 10 Pa·s.

19. The method of claim 18 wherein said substrate comprises a flexible substrate, a cushioning layer and said first material comprises a metal material, wherein after said continuously imprinting, said first material is disposed on said major surface of said substrate and the method further comprises contacting said first material with a second substrate in the presence of heat and/or pressure to transfer the first material having the at least one microscale feature to the second substrate.

20. The method of claim 18 wherein said first material comprises a metal material that is disposed on a said major surface of said substrate prior to said continuous imprinting.

21. The method of claim 18 wherein said first material is disposed on said roller surface prior to said continuous imprinting.

* * * * *